(12) United States Patent
Iwata et al.

(10) Patent No.: US 6,288,429 B1
(45) Date of Patent: Sep. 11, 2001

(54) SEMICONDUCTOR DEVICE

(75) Inventors: Hiroshi Iwata; Seizou Kakimoto, both of Nara-ken; Masayuki Nakano, Tenri; Toshimasa Matsuoka, Yao, all of (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/319,517
(22) PCT Filed: Nov. 27, 1997
(86) PCT No.: PCT/JP97/04344
 § 371 Date: Jul. 7, 1999
 § 102(e) Date: Jul. 7, 1999
(87) PCT Pub. No.: WO98/25307
 PCT Pub. Date: Jun. 11, 1998

(30) Foreign Application Priority Data

Dec. 4, 1996 (JP) .................................................. 8-324465

(51) Int. Cl.⁷ ........................... H01L 29/76; H01L 29/94; H01L 31/062
(52) U.S. Cl. .................. 257/369; 257/57; 257/69
(58) Field of Search .................. 257/369, 372, 257/374, 57, 69

(56) References Cited

U.S. PATENT DOCUMENTS

| | | |
|---|---|---|
| 4,264,857 | 4/1981 | Jambotkar . |
| 5,914,547 | * 6/1999 | Konogi . |
| 5,985,709 | * 11/2000 | Lee et al. . |
| 5,990,535 | * 11/1999 | Palara . |

FOREIGN PATENT DOCUMENTS

WO 96/07205   3/1996  (WO) .

OTHER PUBLICATIONS

Wann, C. et al. (1996). "Channel Profile Optimization And Device Design For Low–Power High–Performance Dynamic–Threshold Mosfet," *International Electron Devices Meeting* New York 1996:113–116.

Kotaki, H. et al. (1996). "Novel Bulk Dynamic Threshold Voltage Mosfet (B–DTMOS) With Advanced Isolation (SITOS) And Gate To Shallow–Well Contact (SSS–C) Processes For Ultra Low Power Dual Gate CMOS," *International Electron Devices Meetig* New York 1996:459–462.

* cited by examiner

Primary Examiner—Stephen D. Meier
(74) Attorney, Agent, or Firm—Morrison & Foerster LLP

(57) ABSTRACT

A semiconductor device which materializes dynamic threshold operation, on the assumption of the application of a bulk semiconductor substrate. The semiconductor substrate has a first conductivity type well region (11), a source region (12) and a drain region (13) of second conductivity type are made in the vicinity of the surface of the first conductivity type of well region (11), a channel region (14) is provided between these regions (12 and 13), a gate insulating film (15) and a gate electrode (16) are stacked in order on the channel region (14), and the gate electrode (16) is connected to the well region (11) through the contact hole (not shown in the figure) of the gate insulating film (15). In this transistor, as compared with a conventional SOI substrate, the resistance of the well region (11) can be lowered to about one-tenth.

39 Claims, 18 Drawing Sheets n-channel area 372   p-channel area 371

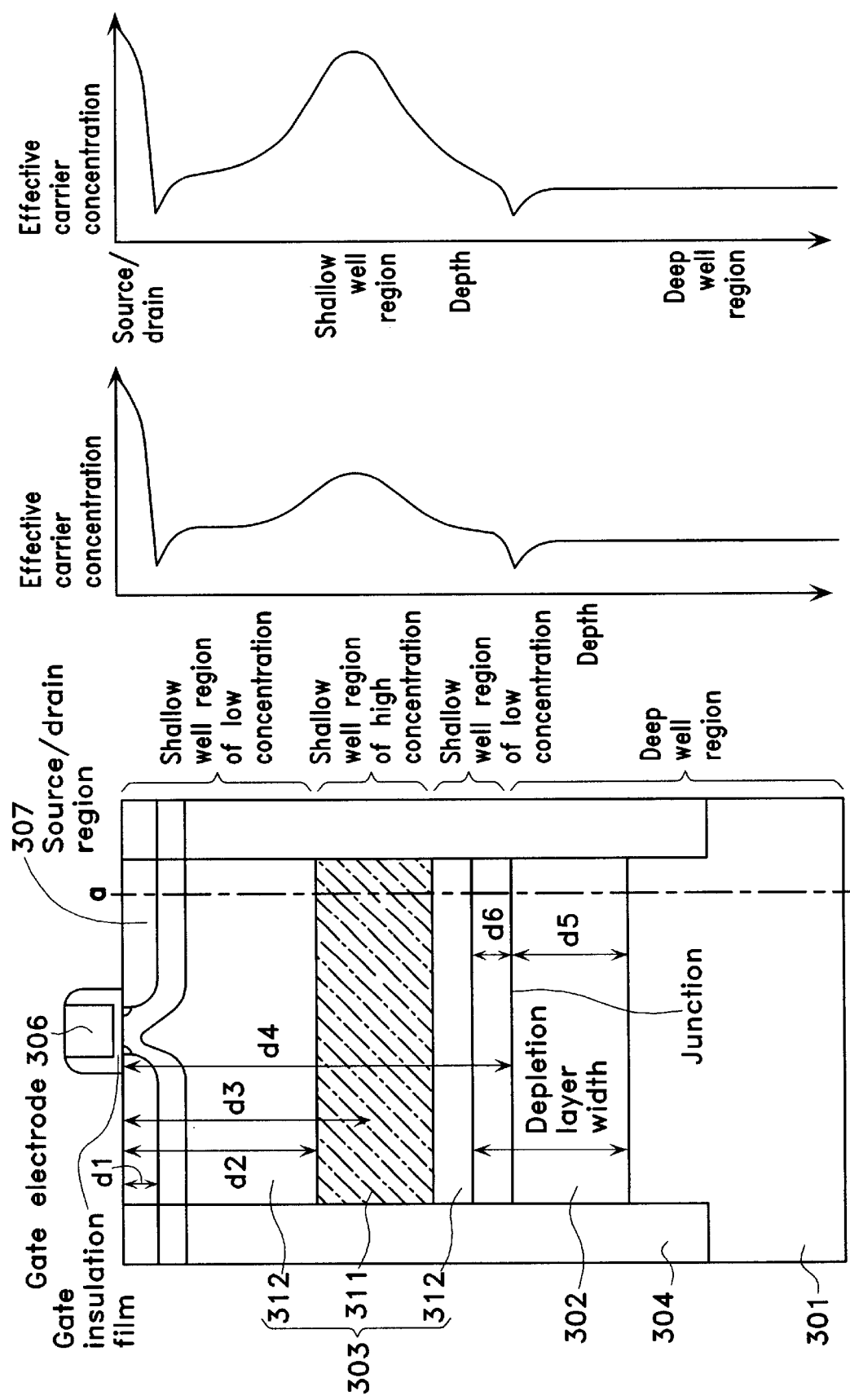

SEMICONDUCTOR DEVICE

This application is a 35 U.S.C. §371 filing of International Patent Application No. PCT/JP97/04344, filed Nov. 27, 1997. This application claims priority benefit of Japanese Patent Application No. 8-324465, filed Dec. 4, 1996.

TECHNICAL FIELD

The present invention relates to a semiconductor device in the form of a transistor which operates at a low power supply voltage by dynamically changing a threshold, and a semiconductor device incorporating such a transistor. The present invention also relates to a device separation technique suitable for integration of such semiconductor devices.

BACKGROUND ART

In a CMOS circuit (a complementary circuit), the power consumption is proportional to the square of the power supply voltage. Therefore, it is effective to reduce the power supply voltage for reducing the power consumption of a CMOS LSI. However, as the power supply voltage is reduced, the driving power of the transistor decreases, thereby posing a problem of an increase in the delay time of the circuit. This problem becomes more significant the more the power supply voltage is reduced. Particularly, it has been known that the increase becomes significant when the power supply voltage is three times the threshold or less.

A possible way to improve this is to reduce the threshold. However, as the threshold is reduced, the leak current when the gate is OFF increases, the lower limit of the threshold is defined by the acceptable OFF current.

In order to alleviate such a problem, there has been proposed, as a transistor for a low power supply voltage, a dynamic threshold operation transistor which realizes a high driving power at a low voltage by reducing an effective threshold when a transistor is ON (A Dynamic Threshold Voltage MOSFET (DTMOS) for Ultra-Low Voltage Operation, F. Assaderaghi et al., IEDM94 Ext. Abst. p.809).

FIG. 19 illustrates a simplified structure of such a dynamic threshold operation transistor (hereinafter, referred to as a "DTMOS"). While a NMOS is illustrated, a PMOS can also be realized with symmetrically opposite polarities.

As illustrated in the figure, an SOI substrate 1 is used, and a gate 3 and the substrate 1 are locally short-circuited with an oversized metal line 2. The essential element is the short-circuiting of the gate 3 and the substrate 1 with each other, and the way they are short-circuited is not limited to the one illustrated.

When a gate bias is applied in the structure in which the gate and the substrate are short-circuited, a forward bias of the same magnitude as the gate bias is applied to a substrate active region. Thus, the same biased state as that in an ordinary translstor results when the gate is OFF. When the gate is ON, the substrate is forwardly biased as the gate bias increases. As a result, the threshold decreases.

However, in this structure, it is necessary, for suppressing the stand-by current, to limit the voltage applied to the gate to about 0.6 V, a voltage at which a lateral parasitic bipolar transistor ts turned ON.

When the gate bias (=body bias) is OPP, such a DTMOS has a leak current comparable to that of an ordinary transistor provided on an SOI substrate and having the same channel state. While the DTMOS is ON, as the gate bias (=body bias) increases, the threshold further decreases, whereby the gate overdrive effect increases, thereby significantly increasing the driving power. The fact that deterioration of mobility is suppressed by the suppression of a vertical electric field on the substrate surface also contributes to the increase in the driving power. Moreover, since the lateral parasitic bipolar transistor is OFF, the significant increase in the stand-by current is suppressed.

However, since the above-described conventional DTMOS uses an SOI substrate, the thickness of the body (the depth of the channel region) is very small (50 nm–200 nm), thereby resulting in a very high resistance. Thus, even if the gate and the body are short-circuited with each other via a contact, a potential is less likely to be transferred to the body at a position farther away from the contact, and the CR time constant increases. Therefore, in view of a transient operation, the effect as a DTMOS is suppressed, and it cannot be operated at a high speed.

Thus, the present invention has been made to solve such problems in the prior art, and has an objective of providing a semiconductor device which realizes a dynamic threshold operation assuming the application of a bulk semiconductor substrate in order to solve the increase in the body resistance of the SOI substrate.

DISCLOSURE OF THE INVENTION

Before the present invention is illustrated, a structure of a semiconductor device based on which the present invention has been made will be discussed.

A semiconductor device based on which the present invention has been made comprises: a semiconductor substrate; a well region of a first conductivity provided on the semiconductor substrate; a source region and a drain region of a second conductivity provided on the well region of the first conductivity type; a channel region provided between the source region and the drain region; a gate insulation film provided on the channel region; and a gate electrode provided on the gate insulation film, wherein the gate electrode is electrically connected to the well region corresponding to the gate electrode.

In such a structure, the resistance of the well region corresponds to the body resistance of the above-described conventional Sol substrate, and the resistance of the well region can be made very small.

More particularly, the body of the above-described conventional SOI substrate has a width equal to the gate length and a length equal to the gate width. Moreover, as described above, the thickness is very thin, i.e., 50 nm–200 nm, and the resistance thereof is very high. For example, when the concentration of the body (i.e., the channel concentration which cannot be high due to the need to reduce the threshold of the transistor) is $1\times10^{17}/cm^3$, and the thickness of the body is 100 nm, the sheet resistance is then about 10 KΩ. When the gate length is 0–2 $\mu$m, and the gate width is 10 $\mu$m, the aspect ratio is then 50, and the resistance value is 500 KΩ, which is 50 times as great as the sheet resistance.

On the contrary, in the semi conductor device based on which the present invention has been made, the depth of the well region can be set freely.

For example, the width of the well region needs to be at least equal to the total width occupied by the source region, the drain region, and the gate region. In view of the fact that a contact region is provided between the source region and the drain region, it is reasonable to set the width of each of the source region and the drain region to be three times as great as the gate length. Thus, the minimum width of the well region needs to be equal to the sum of the width of the source region, the width of the drain region, and the length of the gate region. Thus, it is reasonable to set the minimum width to be seven times as great as the length of the gate region.

Assuming that the length of the well region is equal to the width of the gate region, the aspect ratio is 1/7.

Moreover, even when the concentration of the well region is the same as that of the body of the SOI substrate, the well region is not limited in the depth direction. Therefore, when the depth is set to 1 μm to be within a reasonable range, the sheet resistance of the well region is 1/10 of that of the body of the SOI substrate.

In view of the aspect ratio and the sheet resistance, the resistance of the well region can be reduced to about 1/70 of that of the body of the SOI substrate.

Next, a semiconductor device of the present invention which solves the above-described problems based on the semiconductor device having such a structure will be described.

A semiconductor device of claim 1 comprises: a semiconductor substrate; a deep well region of a first conductivity type provided in the semiconductor substrate: a shallow well region of a second conductivity type provided in the deep well region; a source region and a drain region of the first conductivity type provided in the shallow well region; a channel region provided between the source region and the drain region; a gate insulation film provided on the channel region; and a gate electrode provided on the gate insulation film, wherein: the gate electrode is electrically connected to the shallow well region corresponding to the gate electrode; the shallow well region is electrically separated from an adjacent shallow well region on the semiconductor surface; and a high impurity concentration region is sandwiched between low impurity concentration regions.

With such a structure in which the high impurity concentration region is sandwiched between the low impurity concentration regions, the resistance of the well region can be further reduced. With such a structure, it is possible to effectively reduce the resistance of the well region by the high concentration region in the middle of the shallow well region, while maintaining a low threshold by one of the low concentration regions on the channel side, without increasing parasitic capacitances of the source region and the drain region (when the impurity concentration of the shallow well region at the junction between the source region and the drain region is high, the depletion layer does not sufficiently extend, thereby increasing the junction capacitance). and without increasing the parasitic capacitance between one of the low concentration regions in the shallow well region existing on the deeper well region side and the deep well region.

The sheet resistance can be reduced to some tens of ohms, though the reduction depends upon the concentration of the high concentration region in the middle. In this case, the shallow well region has a sheet resistance of about 1/100–1/1000 of the body resistance of the conventional Sot substrate, so that, assuming that the aspect ratio is 1/7, the resistance can be reduced to about 1/700–1/7000 of the body resistance of the conventional SOI substrate.

Moreover, in this case, the shallow well region is electrically separated from the shallow well region on the semiconductor surface. This structure is necessary when a circuit configuration of a plurality of elements is assumed, since a fundamental structural feature of the present invention is the connection between the gate electrode and the shallow well region.

In the semiconductor device of claim 1, it is preferred that the adjacent shallow well regions are electrically separated from each other by a groove-shaped separation structure which is deeper than the shallow well region but shallower than the deep well region, as set forth in claim 2. With this structure, the area in the bulk semiconductor substrate to be occupied by one transistor can be made comparable to that of a DTMOS provided on the SOI substrate.

A semiconductor device of claim 3 comprises: a semiconductor substrate; a deeper well region of a first conductivity type provided in the semiconductor substrate; a deep well region of a second conductivity type provided in the deeper well region: a shallow well region of the first conductivity type provided in the deep well region of the second conductivity type; a source region and a drain region of the second conductivity type provided on in the shallow well region; a channel region provided between the source region and the drain region; a gate insulation film provided on the channel region; and a gate electrode provided on the gate insulation film, wherein: the gate electrode is electrically connected to the shallow well region corresponding to the gate electrode: the deep well region and the shallow well region are electrically separated from an adjacent deep well region and an adjacent shallow well region, respectively; and the shallow well region includes a high impurity concentration region sandwiched between low impurity concentration regions.

In such a structure, the deeper well region may be provided between the adjacent deep well regions so as to electrically separate the adjacent deep well regions from each other. Particularly, when providing a complementary element having p-type and n-type deep well regions together on a single semiconductor substrate, the deep well regions are separated by a deeper well region having an opposite conductivity type, whereby it is possible to ground the n-type deep well region to GND, and to set the p-type deep well region to the power supply voltage.

On the contrary, in the above-described semiconductor substrate based on which the present invention has been made, if a complementary element is provided with p-type and n-type deep well regions together on a single semiconductor substrate, the p-type and n-type deep well regions are in contact with each other, thereby forming a PN junction between the deep well regions. With this limitation, It is necessary to set the n-type deep well region to the power supply voltage and to ground the p-type deep well region to GND (when the n-type deep well region is grounded to GND while fixing the p-type deep well region to the power supply voltage, a forward current continuously flows regardless of the operation of the element).

In the semiconductor device of claim 3, it is preferred that the deep well region and the shallow well region are electrically separated respectively from the adjacent deep well region and the adjacent shallow well region by a groove-shaped separation structure which is deeper than the deep well region but shallower than the deeper well region, as set forth in claim 4. This structure has an effect that the area in the bulk semiconductor substrate to be occupied by one transistor can be made comparable to that of a DTMOS provided on the SOI substrate.

As set forth in claim 5, when a complementary circuit is provided with the semiconductor device of claim 1 or 3, the design of a CMOS logic of MOSFETs as in the prior art can be used directly. Moreover, since the semiconductor device of the present invention is one which realizes the above-described dynamic threshold operation, it is possible to realize a device which operates at a high speed with very low power consumption.

On the contrary, the CMOS logic formed of DTMOSs using the conventional SOI substrate has an excessively large body resistance as described above, and thus cannot operate at a high speed and thus cannot follow a transient operation. Then, the effect of a DTMOS cannot be expected.

Next, a semiconductor device of claim 6 comprises: a semiconductor substrate of a first conductivity type; a groove-shaped separation region formed in the semiconductor substrate; L plurality of island-like active regions separated from one another by the groove-shaped separation region; a deep well region of a second conductivity type provided in at least one of the island-like active regions, the deep well region of the second conductivity type being surrounded by the groove-shaped Separation region; a shallow well region of the first conductivity type provided for one of island-like active regions where the deep well region surrounded by the groove-shaped separation exists, the shallow well region of the first conductivity type being surrounded by the groove-shaped separation region; a shallow well region of the second conductivity type provided for another one of the island-like active regions where the deep well region surrounded by the groove-shaped separation does not exist, the shallow well region of the second conductivity type being surrounded by the groove-shaped separation region: a source region and a drain region of the second conductivity type provided in the shallow well region of the first conductivity type; a source region and a drain region of the first conductivity type provided in the shallow well region of the second conductivity type; channel regions provided between the source region and the drain region of the first conductivity type and between the source region and the drain region of the second conductivity type; a gate insulation film provided on each of the channel regions; and a gate electrode provided on the gate insulation film, wherein: each gate electrode is electrically connected to the shallow well region corresponding to the gate electrode: and the shallow well region of the first conductivity type, the shallow well region of the second conductivity type, and the deep well region of the second conductivity type are electrically separated respectively from an adjacent shallow well region of the first conductivity type, an adjacent shallow well region of the second conductivity type, and an adjacent deep well region of the second conductivity type.

A semiconductor device of claim 7 comprises: a semiconductor substrate; a deeper well region of a first conductivity type provided on the semiconductor substrate; a groove-shaped separation region provided in the deeper well region; a plurality of island-like active regions separated from one another by the groove-shaped separation region; a deep well region of a second conductivity type provided in at least one of the is land-like active regions, the deep well region of the second conductivity type being surrounded by the groove-shaped separation region; a shallow well region of the first conductivity type provided for one of the island-like active regions where the deep well region surrounded by the groove-shaped separation region exists, the shallow well region of the first conductivity type being surrounded by the groove-shaped separation region: a shallow well region of the second conductivity type provided for another one of the island-like active regions where the deep well region surrounded by the groove-shaped separation region does not exist, the shallow well region of the second conductivity type being surrounded by the groove-shaped separation region; a source region and a drain region of the second conductivity type provided in the shallow well region of the first conductivity type; a source region and a drain region of the first conductivity type provided in the shallow well region of the second conductivity type; channel regions provided between the source region and the drain region of the first conductivity type and between the source region and the drain region of the second conductivity type; a gate insulation film provided on each of the channel regions; and a gate electrode provided on the gate insulation film, wherein: each gate electrode is electrically connected to the shallow well region corresponding to the gate electrode; and the shallow well region of the first conductivity type, the shallow well region of the second conductivity type, and the deep well region of the second conductivity type are electrically separated respectively from an adjacent shallow well region of the first conductivity type, an adjacent shallow well region of the second conductivity type, and an adjacent deep well region of the second conductivity type.

Moreover, a semiconductor device of claim 8 comprises: a semiconductor substrate of a first conductivity type: a groove-shaped separation region provided in the semiconductor substrate; a plurality of island-like active regions separated from one another by the groove-shaped separation; a deep well region of the first conductivity type provided in at least one of the island-like active regions, the deep well region of the first conductivity type being surrounded by the groove-shaped separation: a deep well region of a second conductivity type provided in another one of the island-like active regions where the deep well region of the first conductivity type does not exist, the deep well region of the second conductivity type being surrounded by the groove-shaped separation region; a shallow well region of the second conductivity type provided in an upper portion of the deep well region of the first conductivity type, the shallow well region of the second conductivity type being surrounded by the groove-shaped separation region: a shallow well region of the first conductivity type provided in an upper portion of the deep well region of the second conductivity type, the shallow well region of the first conductivity type being surrounded by the groove-shaped separation; a source region and a drain region of the second conductivity type provided in the shallow well region of the first conductivity type; a source region and a drain region of the first conductivity type provided in the shallow well region of the second conductivity type; channel regions provided between the source region and the drain region of the first conductivity type and between the source region and the drain region of the second conductivity type; a gate insulation film provided on each of the channel regions; and a gate electrode provided on the gate insulation film, wherein: each gate electrode is electrically connected to the shallow well region corresponding to the gate electrode; and the shallow well region of the first conductivity type, the shallow well region of the second conductivity type, the deep well region of the first conductivity type, and the deep well region of the second conductivity type are electrically separated respectively from an adjacent shallow well region of the first conductivity type, an adjacent shallow well region of the second conductivity type, an adjacent deep well region of the first conductivity type, and an adjacent deep well region of the second conductivity type.

The structures of claims 6, 7 and 8 are preferred for realizing a complementary circuit, and allow for free arrangement of n-channel and p-channel elements, without increasing the area to be occupied by a transistor or having to provide a boundary rule between the well regions (the n well and the p well must be separated by at least a certain distance so that latch-up does not occur).

BRIEF DESCRIPTION OF THE DRAWINGS

FIG. 18 illustrates a semiconductor device according to an example of the present invention, wherein: (a) is a cross-sectional view thereof; and (b) and (c) each are a graph illustrating an effective carrier concentration along a–a' in (a).

BEST MODE FOR CARRYING OUT THE INVENTION

First, in order to assist the understanding of the present invention, a simplified structure of a semiconductor device, based on which the present invention has been made, will be described with reference to FIG. 1.

Figure 1:
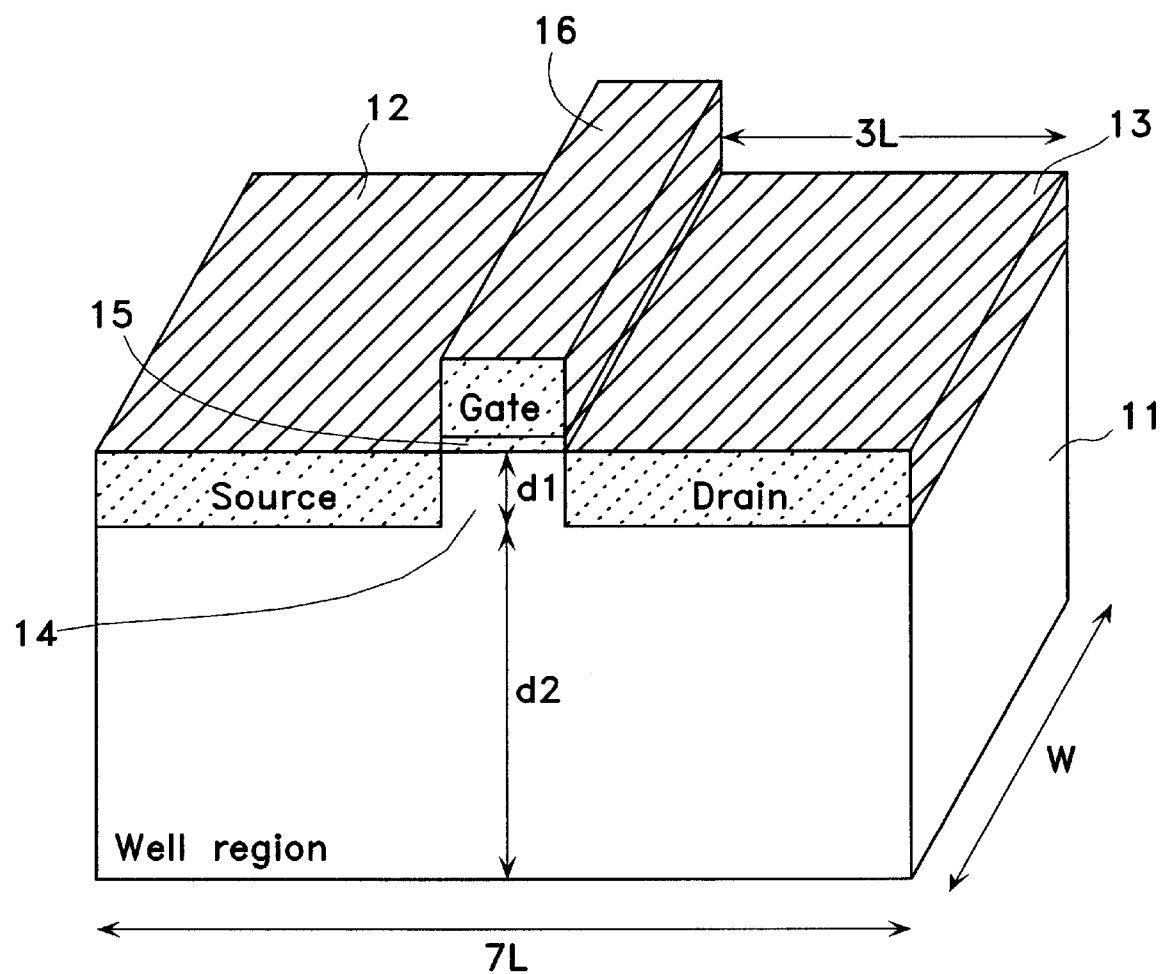
FIG. 1 is a view schematically illustrating a semiconductor device based on which the present invention has been made.

Referring to FIG. 1, a semiconductor substrate (a bulk semiconductor substrate) of the semiconductor device (hereinafter, referred to also as a "transistor") comprises: a well region 11 of a first conductivity type; a source region 12 and a drain region 13 of a second conductivity type provided in the vicinity of the surface of the well region 11 of the first conductivity type; a channel region 14 provided between the regions 12 and 13: and a gate insulation film 15 and a gate electrode 16 deposited in this order on the channel region 14, wherein the gate electrode 16 is connected to the well region 11 via a contact hole (not shown) in the gate insulation film 15.

Figure 2:
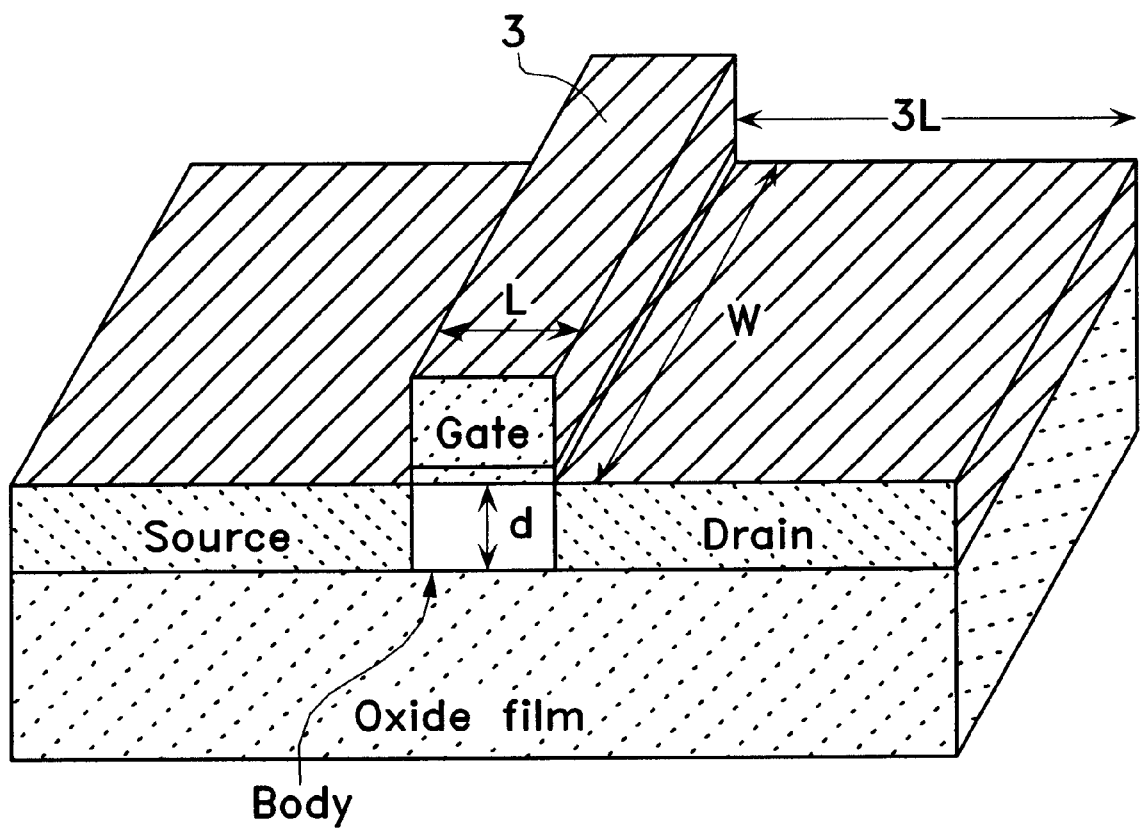
FIG. 2 is a view schematically illustrating a conventional DTMOS.
Figure 19:
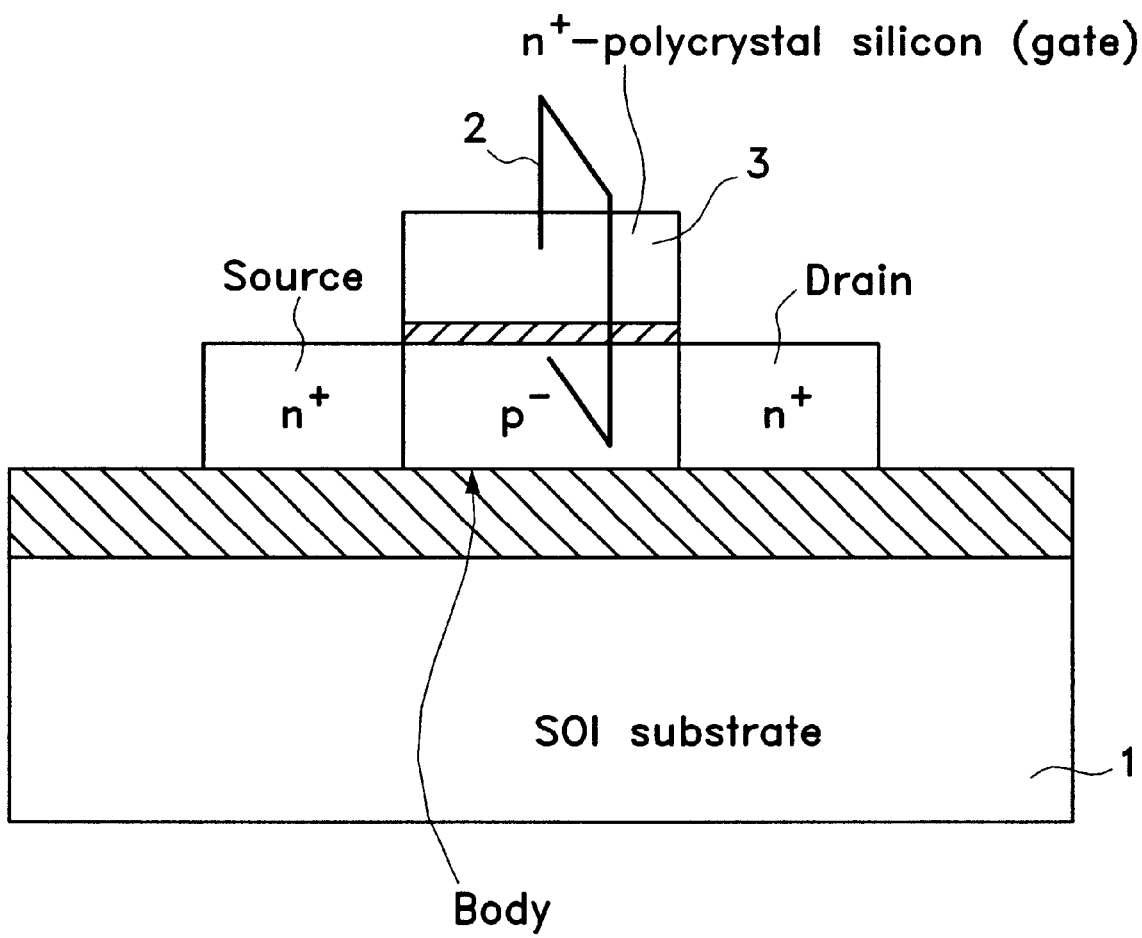
FIG. 19 is a view schematically illustrating a conventional DTMOS.

In this case, the source region 12 and the drain region 13 require respectively sufficient areas for providing a contact hole for line connections. Therefore, the width of each of the source region 12 and the drain region 13, is set to be three times as great as the gate length L (a generally-employed minimum process dimension) i.e., a commonly acceptable dimension. Moreover, w denotes the gate width, d1 denotes the depth of the channel region 14, d1+d2 denotes the depth of the well region 11, and ρ denotes the specific resistance of the well region 11. Furthermore, R1 denotes the resistance of the channel region 14, R2 denotes the resistance of the source region 12, the drain region 13, and a region below the channel region 14. Then, the resistance R of the well region 11 is expressed as in Expression (1) below.

$$R = \frac{1}{\frac{1}{R_1} + \frac{1}{R_2}} \qquad \text{Expression (1)}$$

$$= \frac{1}{\frac{1}{\frac{W}{L}\frac{\rho}{d_1}} + \frac{1}{\frac{W}{7L}\frac{\rho}{d_2}}} = \frac{W\rho}{L(d_1 + 7d_2)} \qquad \text{Expression (1)}$$

Where a DTMOS of the conventional SOI substrate illustrated in FIG. 19 is formed as illustrated in FIG. 2, so that the dimensions and structures of the source region, the drain region and the channel region of the DTMOS are matched with those of the device illustrated in FIG. 1, and where the concentration of the body is made to be equal to that of the well region 11, and the specific resistance of the body is denoted by ρ, the body resistance R0 is then expressed as in Expression (2) below.

$$R_0 = \frac{W}{L}\frac{\rho}{d_1} \qquad \text{Expression (2)}$$

As can be seen from the expression, the depth of the channel region 14 and the thickness of the body are denoted commonly by d1 and are equally set to 100 nm, for example. The depth d1+d2 of the well region 11 is set to 1 μm. Then, d1=9d2, and the resistance R of the well region 11 is expressed as in Expression (3) below.

$$R = \frac{W\rho}{L(d_1 + 63d_1)} = \frac{W\rho}{64Ld_1} = \frac{R_0}{64} \quad \text{Expression (3)}$$

Therefore, in the transistor based on which the present invention has been made, it is possible to reduce the resistance R of the well region 11 to 1/64 of that of the conventional SOI substrate.

The concentration of the well region 11 and the concentration of the body of the conventional SOI substrate were assumed to be $1 \times 10^{17}/\text{cm}^2$ as an average concentration. It is noted that the latter body concentration of the SOI substrate is directly related to, and limited by, the threshold.

The illustrated dimensions of the well region 11, the source region 12, the drain region 13, the channel region 14, etc., are merely illustrative, and can be changed to various other dimensions.

Figure 3:
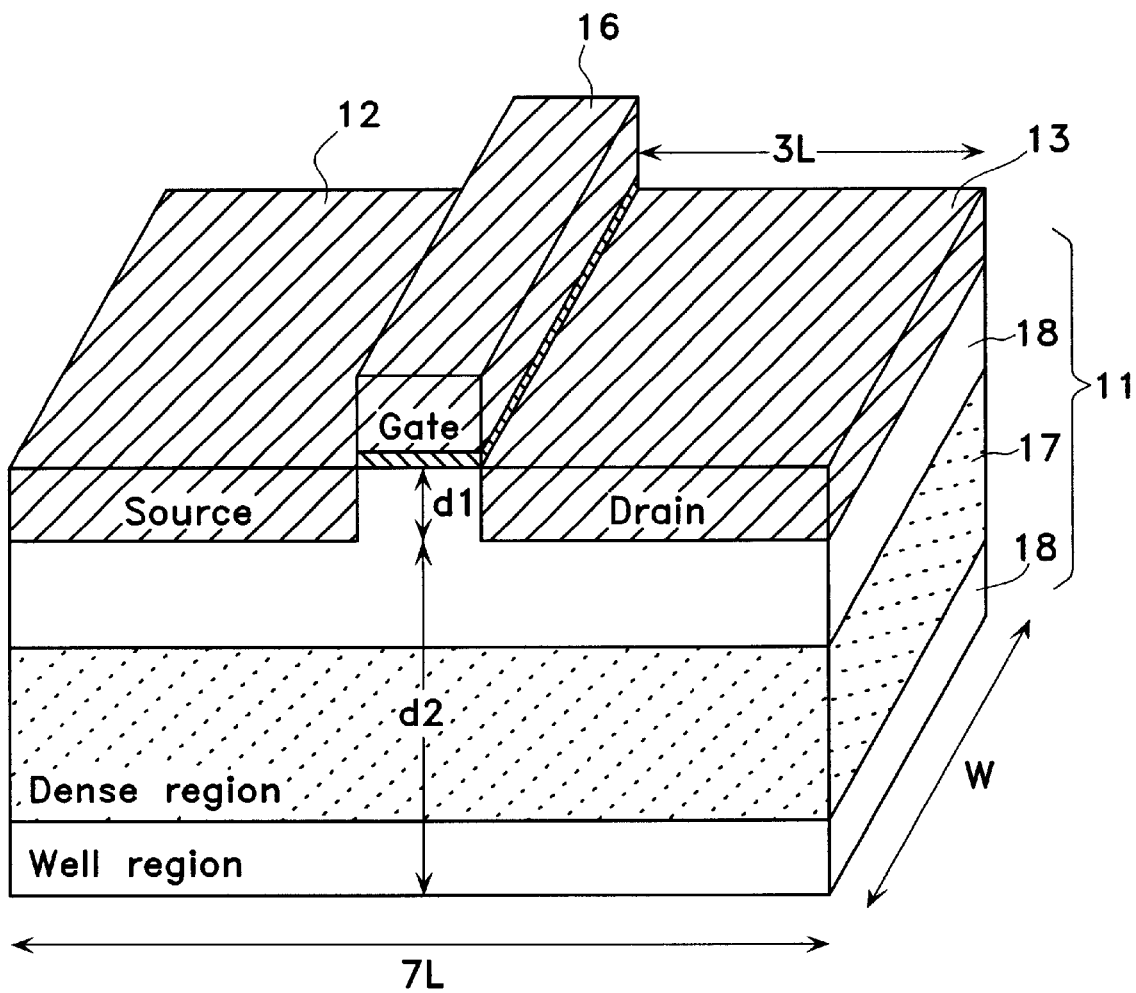
FIG. 3 is a view schematically illustrating a semiconductor device according to the first embodiment of the present invention.

FIG. 3 schematically illustrates a semiconductor device according to the first embodiment of the present invention. In the figure, members that provide similar functions to those of FIG. 1 are provided with like reference numerals.

The device of the first embodiment corresponds to the device of claim 1.

In this embodiment, the well region 11 has a structure in which a high impurity concentration region 17 is sandwiched between low impurity concentration regions 16. This structure provides further reduction in the resistance. Moreover, the well region 11 is electrically separated from an adjacent shallow well region on the semiconductor surface.

In the conventional SOI substrate, the body concentration directly affects the threshold, as described above, whereby the body concentration cannot be increased.

On the contrary, when using a bulk semiconductor substrate as in this embodiment, the impurity concentrations of regions other than the channel region in the well region can be increased so as to freely set the resistance of the well region irrespective of the threshold. For example, the relationship between the impurity concentration and the resistance is discussed on page 32 of the text of "Physics of Semiconductor Devices, 2nd Edition: written by S. M. Sze". The resistance can be dramatically changed depending upon the impurity concentration. A concentration difference between a concentration on the order of $10^{17}$ and a concentration on the order of $10^{19}$ per cubic centimeter results in a resistance difference of about 1.5–2 orders of magnitude (of course, a higher concentration results in a lower resistance).

For example, when the region 17 having a high impurity concentration of $1 \times 10^{19}/\text{cm}^2$ is provided in the well region 11 of $1 \times 10^{17}/\text{cm}^2$ in the first embodiment, a further reduction in resistance from that of FIG. 1 by an order of magnitude or more can be provided. The high impurity concentration region 17 is buried at a position away from the channel region 14, and thus does not affect the threshold.

Now, the basic operation of the transistor of the present invention will be analyzed.

First, the following simplified Expression (4) shows the relationship between the threshold $V_{th}$ of an ordinary MOSFET and the bias ($V_{s-well}$) of the shallow well region.

$$V_{th} = 2\phi_b + \frac{2qN_{s-well}\varepsilon_s(2\phi_b - V_{s-well})}{C_{OX}} + V_{FB} \quad \text{Expression (4)}$$

Herein, $\Phi b$ denotes the Fermi potential, $N_{s-well}$ denotes an impurity concentration of the shallow well region, $\varepsilon_s$ denotes the dielectric constant of the shallow well region, q denotes a quantity of the charge of an electron, $C_{ox}$ denotes a gate insulation film capacitance per unit area, and $V_{FB}$ denotes a flat band voltage.

It can be seen from Expression (4) above that the absolute value of the threshold decreases when the shallow well region is forwardly biased.

The simplified expression of the driving current is expressed as in Expression (5) below in a linear domain.

$$I_D = \frac{W}{L}\mu_{eff}C_{OX}\left[(V_{GS} - V_{th})V_{DS} - \frac{1}{2}V_{DS}^2\right] \quad \text{Expression (5)}$$

It is expressed as in Expression (6) below in a saturation domain.

$$I_D = \frac{1}{2}\frac{W}{L}\mu_{eff}C_{OX}(V_{GS} - V_{th})^2 \quad \text{Expression (6)}$$

Herein, $I_D$ denotes the drain current, a denotes the gate width, L denotes the gate length, $\mu_{eff}$ denotes the effective mobility, $V_{GS}$ denotes the gate potential with respect to the source potential, and denotes $V_{DS}$ the drain potential with respect to the source potential.

Figure 4:
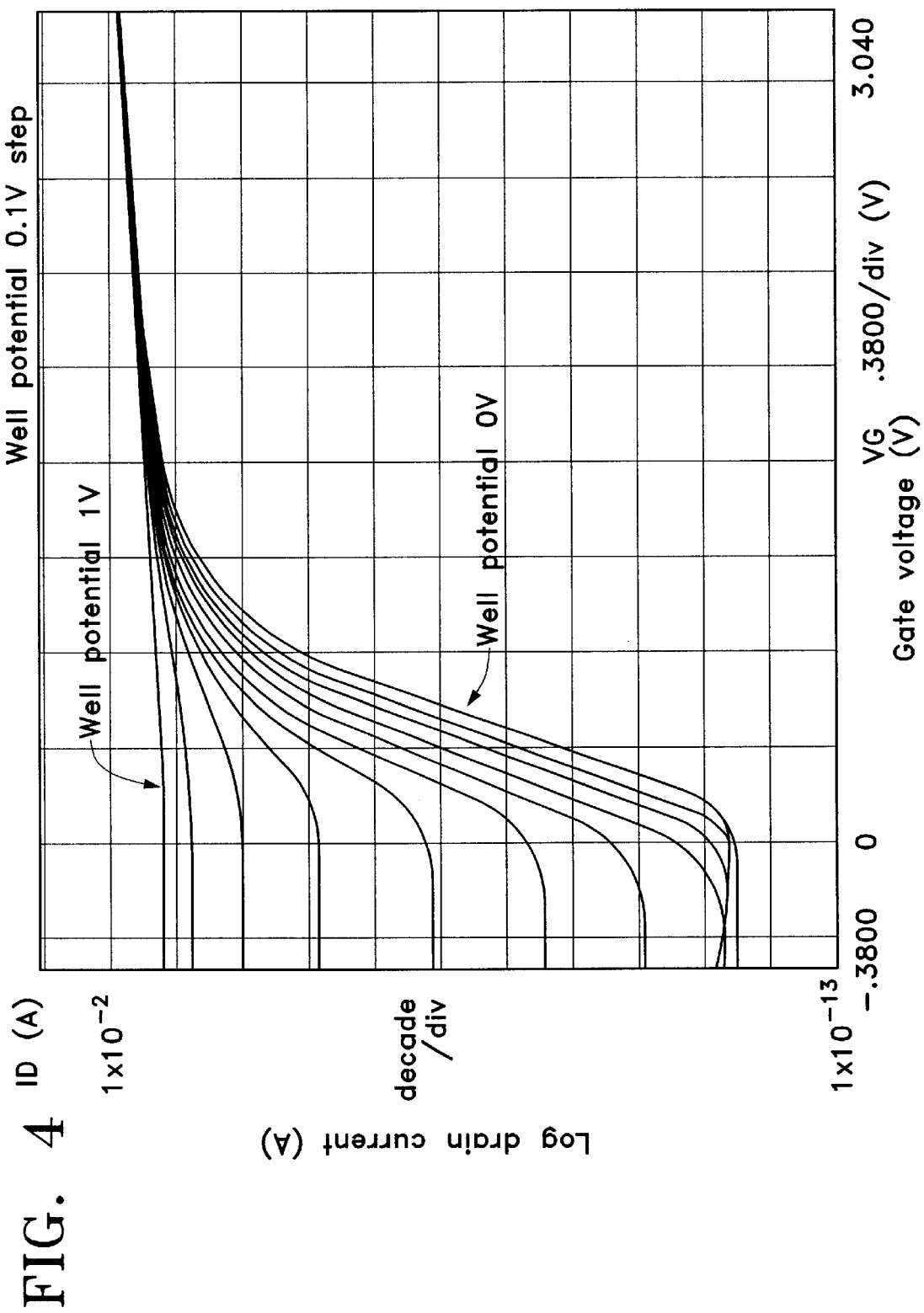
FIG. 4 is a graph illustrating a relationship between a gate voltage and a drain current when a potential of a shallow well region is varied in a transistor of the present invention.
Figure 5A:
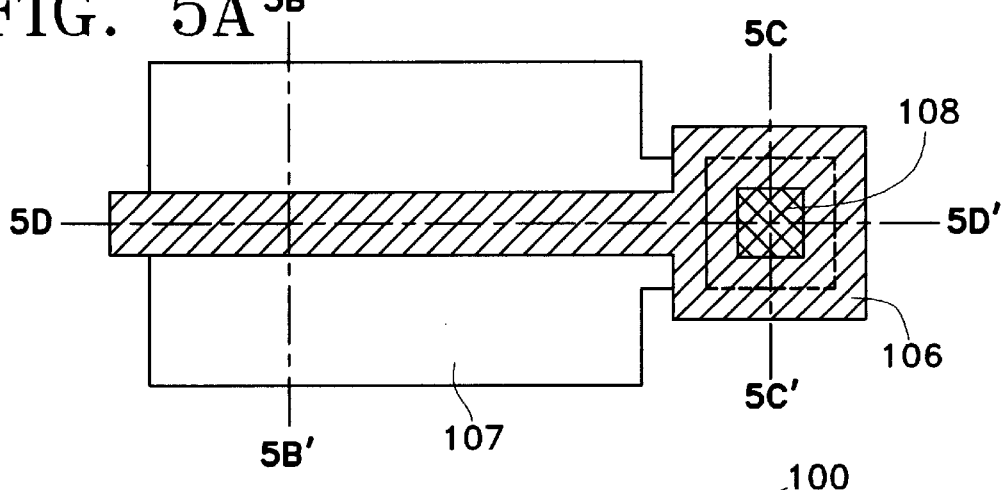
FIG. 5 illustrates a semiconductor device according to the second embodiment of the present invention, wherein: (a) is a plan view thereof; (b) is a cross-sectional view thereof along b—b' in (a); (c) is a cross-sectional view thereof along c–c' in (a); and (d) it a cross-sectional view thereof along d–d' in (a).
Figure 5B:
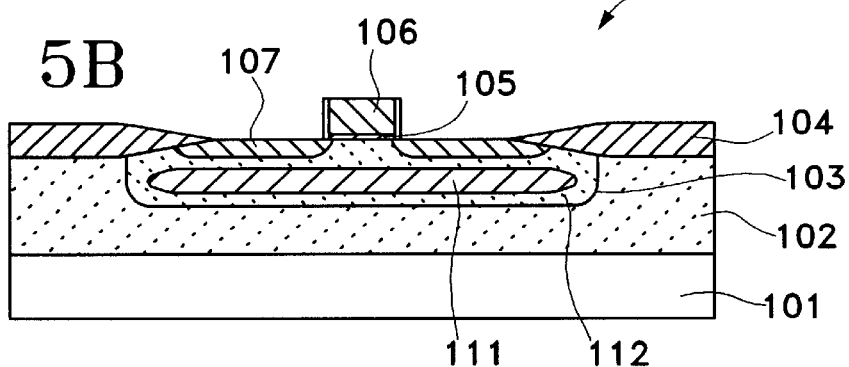
Figure 5C:
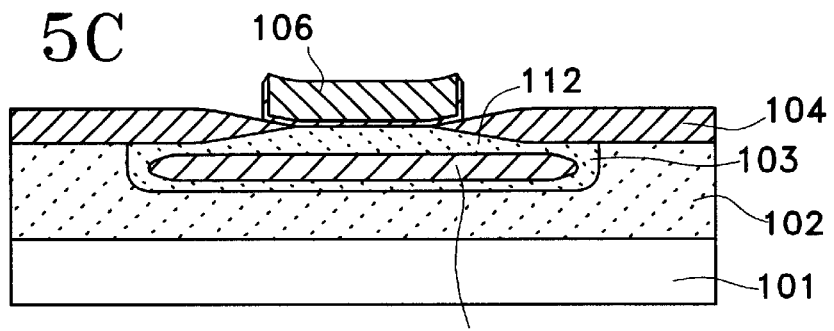
Figure 5D:
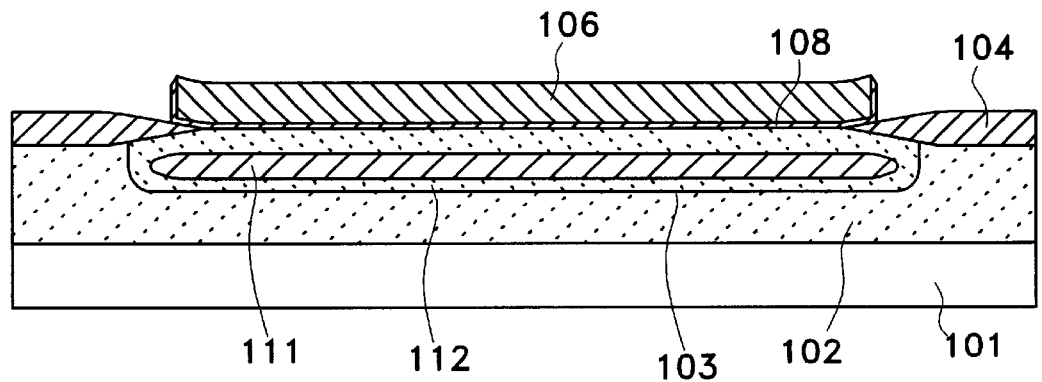

The graph of FIG. 4 illustrates the relaltionship between the gate voltage and the drain current when the potential of the shallow well region is varied. Herein, the gate voltage refers to a gate electrode potential with respect to a source region potential.

With the driving current expressed as in Expressions (5) and (6), it is possible to obtain a larger driving current at a dramatically smaller power supply voltage as the absolute value of the threshold $V_{th}$ decreases.

In the translator of the present invention, the gate electrode and the shallow well region are connected together, whereby the potential of the shallow well region changes as the gate potential changes. Therefore, as is apparent from the expressions above, the shallow well region is forwardly biased, and thus the apparent threshold $V_{th}'$ decreases as the gate potential changes (for n-channel transistors, a positive potential with respect to the source potential is applied to the gate electrode; for p-channel transistors, a negative potential with respect to the source potential is applied to the gate electrode). As a result, it is possible to obtain a large driving current by a low power supply voltage. This effect is particularly significant when the power supply voltage is small.

Therefore, the threshold $V_{th}''$ of the transistor of the present invention can be obtained as a solution to the simultaneous equations of Expressions (4) and (7) below.

$$V_{th} = 2\phi_b + \frac{2qN_{s-well}\varepsilon_s(2\phi_b - V_{s-well})}{C_{OX}} + V_{FB} \quad \text{Expression (4)}$$

$$V_{th} = V_{GS} = V_{s-well} \quad \text{Expression (7)}$$

Expression (6) above expresses a drain current in a saturation domain (the speed of a circuit is determined by this amount of current and the CR time constant), and $V_{th}$ in Expression (6) is the value when the potential $V_{s-well}$ of the well region is at the power supply voltage. In an ordinary MOSEET, the well region and the source region are at the same potential, and thus the threshold stays constant even when the gate voltage changes. In the transistor of the present invention, on the other hand, the gate electrode and the shallow well region are short-circuited with each other, and thus the potential $V_{s-well}$ of the well region changes according to the gate potential, thereby changing the apparent threshold. Then, Expression (6) can be rearranged into Expression (8) below assuming that the power supply voltage is $V_{DD}$ and $V_{th}$ for $V_{GS}=V_{s-well}=V_{DD}$ is the apparent $V_{th}'$.

$$I_D = \frac{1}{2}\frac{W}{L}\mu_{eff}C_{OX}(V_G - V_{th}')^2 \qquad \text{Expression (8)}$$

In short, there is a relationship as follows among the threshold $V_{th}$ of an ordinary MOSFET when the source region and the well region of the MOSFET are at the same potential, the threshold $V_{th}''$ of the transistor of the present invention, and the apparent threshold $V_{th}'$ of the transistor of the present invention.

$V_{th}'(V_{GS}=V_{s-well}=V_{DD})<V_{th}''(V_{GS}=V_{s-well}=V_{th}'')<V_{th}(V_{sub}=V_s:$ typically set to the ground potential)

Herein, $V_{sub}$ denotes the potential of the substrate (the well), and $V_s$ denotes the source potential.

In the transistor of the present invention, the apparent threshold $V_{th}'$ can be dramatically reduced from the threshold $V_{th}$ of the ordinary MOSFET.

For the transistor of the present invention, Expression (9) below can be obtained by replacing the current and the voltage in Expression (8) with the driving current ($I_{drive}$) and the power supply voltage (VDD).

$$I_{drive} = \frac{1}{2}\frac{W}{L}\mu_{eff}C_{OX}(V_{DD} - V_{th}')^2 \qquad \text{Expression (9)}$$

For the ordinary MOSFET, Expression (10) below can be obtained by replacing the current and the voltage in Expression (6) with the driving current ($I_{drive}$) and the power supply voltage ($V_{DD}$).

$$I_{drive} = \frac{1}{2}\frac{W}{L}\mu_{eff}C_{OX}(V_{DD} - V_{th})^2 \qquad \text{Expression (10)}$$

In an ordinary MOSFET, the threshold cannot be reduced sufficiently due to an influence of the short channel effect. On the contrary, the transistor of the present invention is very advantageous for a low power supply voltage (when $V_{DD}$ is small). For example, when $V_{DD}$=0.6 V and $V_{th}$=0.3 V, $V_{th}'$ is about 0.15 V, and $(V_{DD}-V_{th})^2$ and $(V_{DD}-V_{th}')^2$ are 0.09 and 0.2029, respectively, whereby it is possible to obtain an approximately doubled driving current for the same power supply voltage. When the power supply voltage is further reduced, the present invention will be even more advantageous.

In such a transistor, the gate potential and the potential of the shallow well region coincide with each other, whereby a forward bias is applied to the pn junction formed between the shallow well region and the source region (and the drain region). More specifically, in the case of an n-channel transistor, the potential of the source region is equal to the GND potential, and the potential of the shallow well region is equal to the gate potential. In the case of a p-channel transistor, on the other hand, the potential of the source region is equal to the power supply voltage, and the potential of the shallow well region is equal to the gate potential. In order to prevent a forward current from being conducted, it is necessary to keep the voltage between the well region and the source region (or the voltage between the well region and the drain region) to be less than or equal to the built-in potential of the pn junction. When such a voltage exceeds the built-in potential, the forward current of the pn junction diode is conducted between the shallow well region and the source region (or the drain region). When the potential of the shallow well region is increased to be around the built-in potential, a non-negligible level of pn junction diode forward current is conducted. Therefore, it is preferred to set the power supply voltage so that the potential of the well region is lower than the built-in potential by about 0.1–0.3 V.

FIG. 5 illustrates a semiconductor device according to the second embodiment of the present invention, wherein: (a) is a plan view thereof; (b) is a cross-sectional view thereof along b–b' in (a); (o) is a cross-sectional view thereof along c–c' in (a); and (d) is a cross-sectional view thereof along d–d' in (a). In the figure, members that provide similar functions to those of FIG. 1 are provided with like reference numerals.

The device of the second embodiment corresponds to the device of claim 1.

The transistor of the second embodiment comprises: a deep well region 102 provided in an Si semiconductor substrate 101; a shallow well region 103 provided in the deep well region 102, the shallow well region 103 being shallower than the deep well region 102 and having the opposite conductivity type to that of the deep well region 102; a source region 107 and a drain region 107 provided in the shallow well region 103, the source region 107 and the drain region 107 having the opposite conductivity type to that of the shallow well region 103, i.e., the same conductivity type as that of the deep well region 102; and a gate electrode 106 overlying the channel region between the source region 107 and the drain region 107 via a gate insulation film 105, thereby providing a transistor comprising the source region 107, the drain region 107 and the gate electrode 106.

This embodiment is characterized in that the gate electrode 106 of the transistor is electrically connected to the shallow well region 103 via a contact hole 108. The embodiment is also characterized in that the shallow well region 103 is electrically separated from an adjacent shallow well region comprising another semiconductor device.

As in the first embodiment, the shallow well region 103 has a structure in which a high concentration region 111 is sandwiched between low concentration regions 112 so as to reduce the resistance of the shallow well region 103.

With such a structure, it is possible to realize a dynamic threshold operation without using an SOI (Silicon On Insulator) substrate.

Figure 6:
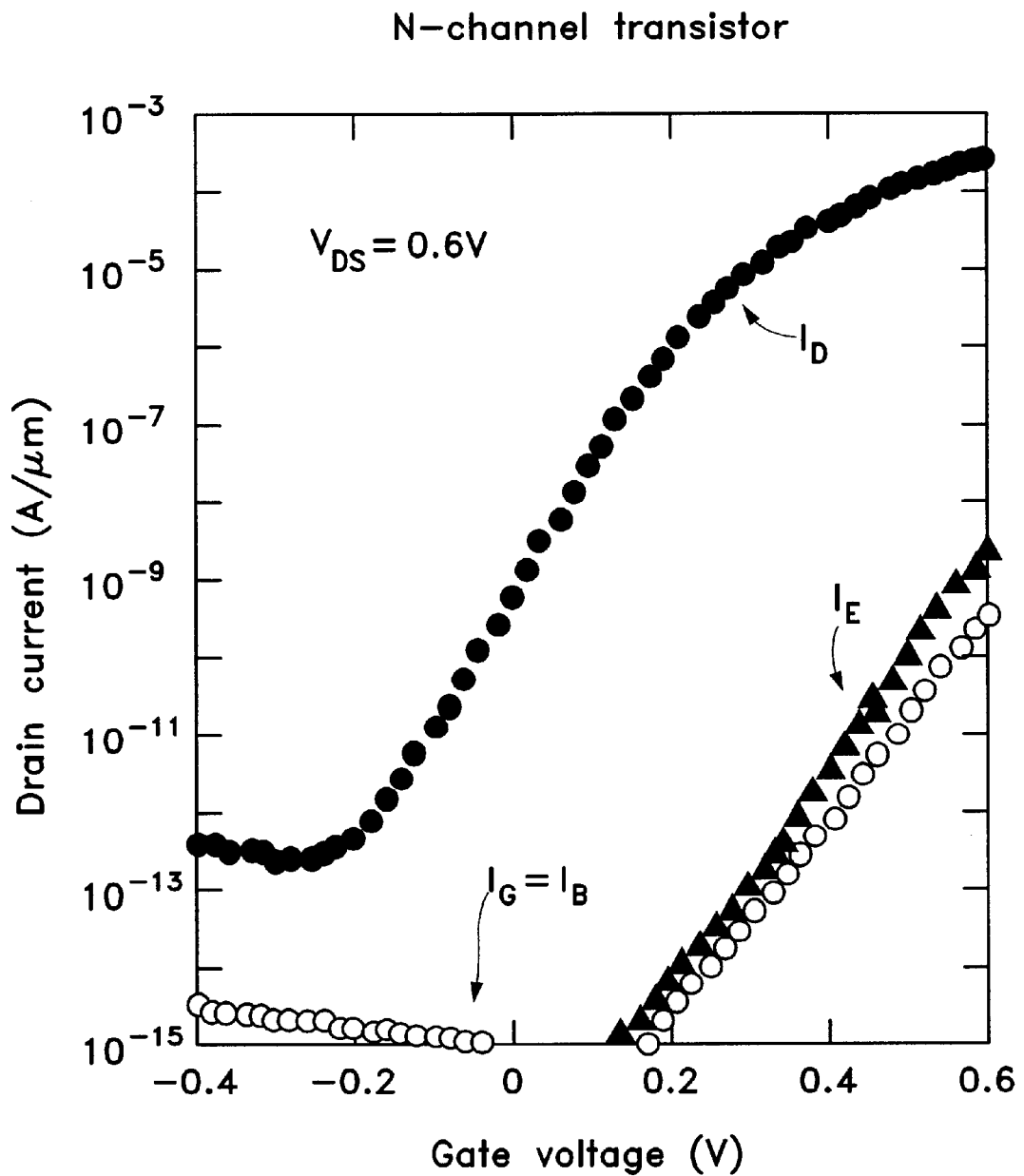
FIG. 6 is a graph illustrating a relationship between a gate voltage and a drain current in an n-channel transistor having a structure as illustrated in FIG. 5.
Figure 7:
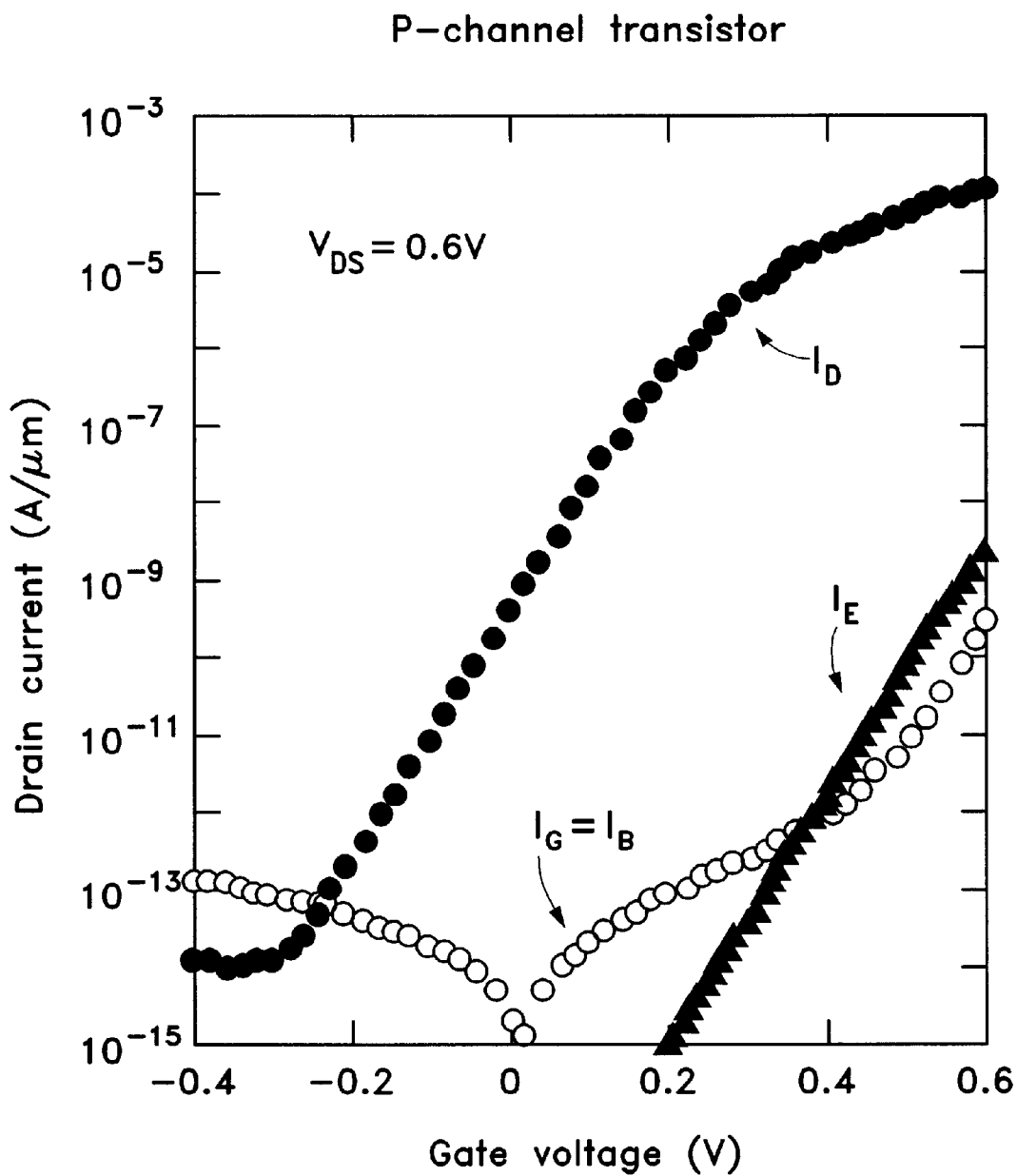
FIG. 7 is a graph illustrating a relationship between a gate voltage and a drain current in a p-channel transistor having a structure as illustrated in FIG. 5.
Figure 8A:
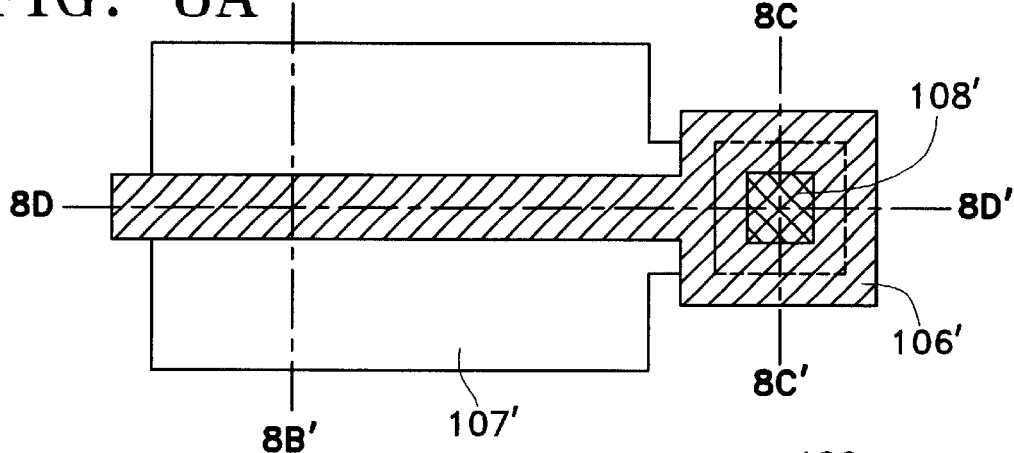
FIG. 8 illustrates a variation of the semiconductor device of FIG. 5, wherein: (a) is a plan view thereof: (b) is a cross-sectional view thereof along b–b' in (a); (c) is a cross-sectional view thereof along c–c' in (a); and (d) is across-sectional view thereof along d–d' in (a).
Figure 8B:
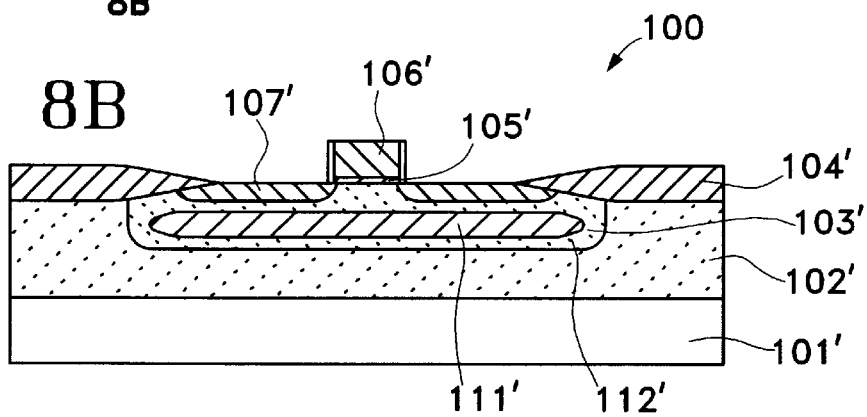
Figure 8C:
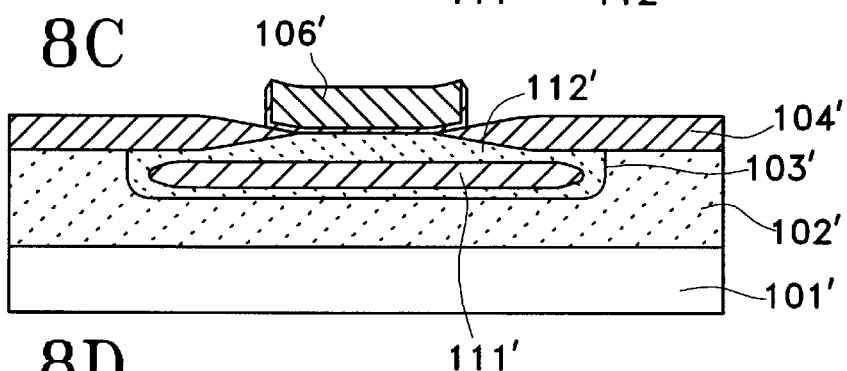
Figure 8D:
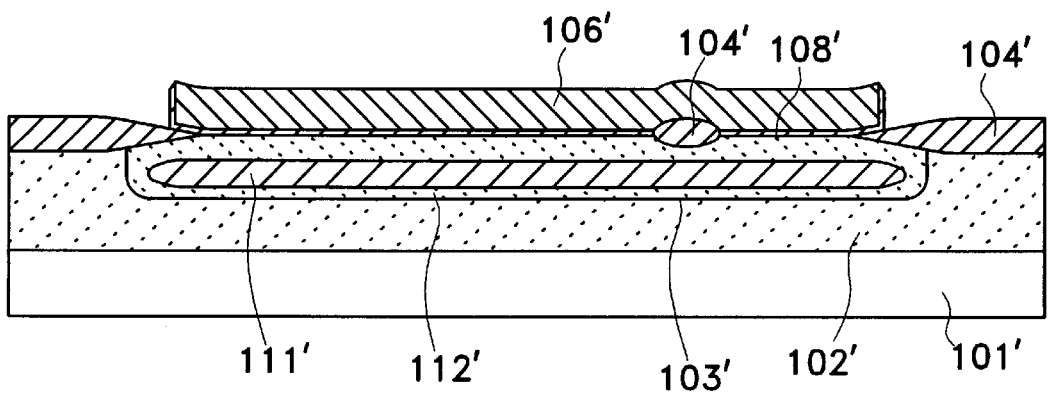

FIGS. 6 and 7 illustrate a relationship between the gate potential and the driving current of the transistor of the second embodiment. As Jo apparent from the figure, the gradient of a curve in the sub-threshold region (an amount of change in the gate potential required to increase the driving current by an order of magnitude) is about 60 mV/dec. With this transistor, It is possible to obtain a large driving current by a small change in the gate potential as compared to the gradient of a curve in the sub-threshold region of an ordinary MOSFET (80 mV/dec–100 mV/dec).

In the second embodiment, the impurity concentration of the deep well region la set to about $1\times10^{16}/cm^3$–$1\times10^{17}/cm^3$, and the impurity concentration of the shallow well region is set to $5\times10^{16}/cm^3$–$5\times10^{17}/cm^3$. The depth of the shallow well region is set to 500 nm–1500 nm. In the shallow well region, the high concentration region 111 is provided so that the concentration has its peak at a depth of 250–600 nm. The peak concentration is $5\times10^{17}/cm^3$–$1\times10^{21}/cm^3$.

The impurity concentration of the source region and the drain region is set to be equal to or greater than about $1\times10^{20}/cm^3$, and the junction depth is set to 50 nm–300 nm. In order to suppress the short channel effect of the transistor, the junction depth of the source region and the drain region should be as small as possible, and the gate insulation film should be as thin as possible.

FIG. 8(*a*) illustrates a variation of the semiconductor device of FIG. 5, wherein: (a) is a plan view thereof; (b) is a cross-sectional view thereof along b–b' in (a); (c) is a cross-sectional view thereof along c–c' in (a); and (d) is a cross-sectional view thereof along d–d' in (a).

In this variation, a deep well region 102' is provided in a semiconductor substrate 101', and a shallow well region 103' is provided in the deep well region 102'. The conductivity type of the shallow well region 103' is opposite to that of the deep well region and is the same as that of the semiconductor substrate 101'.

More specifically, the transistor comprises: a source region and drain region 107' provided in the shallow well region; a channel region provided between the source region and the drain region; a gate insulation film 105' covering the channel region, and a gate electrode 106' provided on the gate insulation film 105'. The gate electrode 106' is electrically connected to the shallow well region 103' via a contact hole 108' provided in the gate insulation film 105'.

The illustrated shallow well region 103' is electrically separated from an adjacent shallow well region (not shown) by a device separation oxide film 104'.

In this variation, the device separation oxide film 104' is also present between a region where the contact between the gate electrode and the shallow well region is provided and a region where the source region and the drain region are provided.

In the structure as in the second embodiment comprising a shallow well region and a deep well region, a parasitic bipolar transistor affects the operation of the transistor. This will be described.

Figure 9:
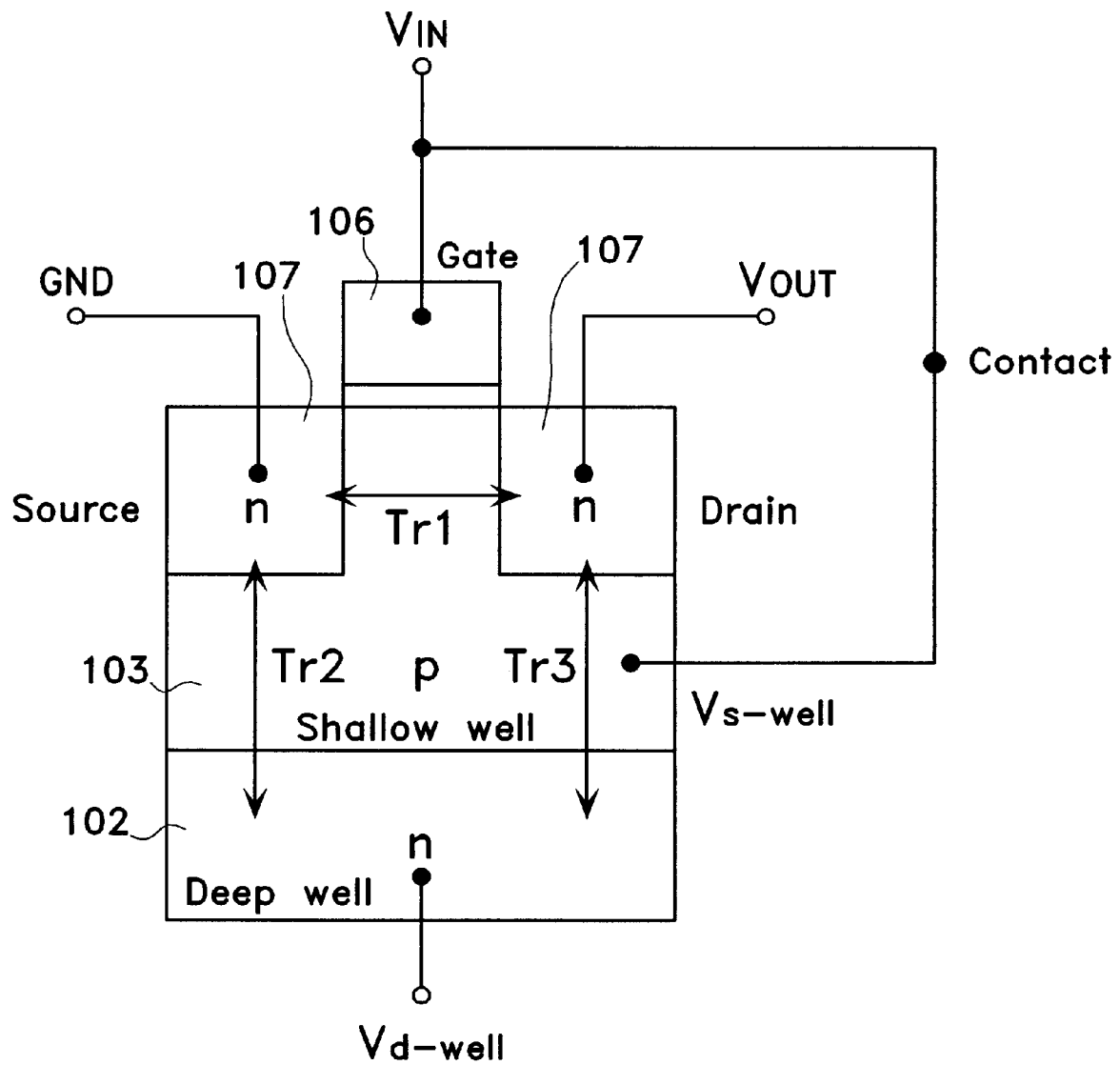
FIG. 9 is a view schematically illustrating a layout of a transistor of the present invention and a parasitic bipolar transistor.
Figure 10A:
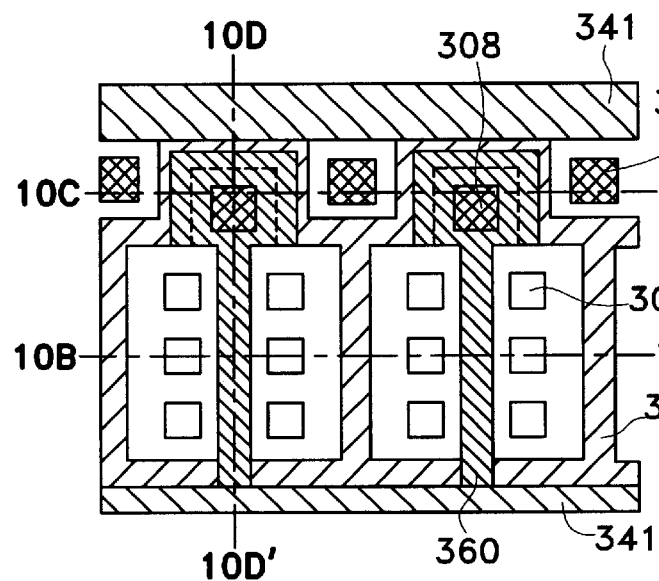
FIG. 10 schematically illustrates a semiconductor device according to the third embodiment of the present invention, wherein: (a) is a plan view thereof (b) is a cross-sectional view thereof along b–b' in (a); (c) is a cross-sectional view thereof along c–c' in (a); and (d) is a cross-sectional view thereof along d–d' in (a).
Figure 10D:
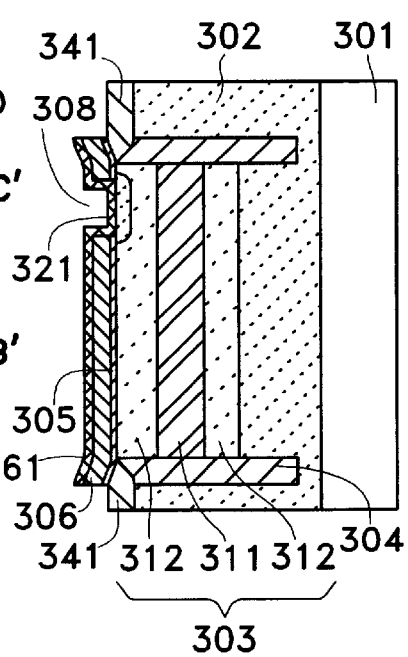
Figure 10B:
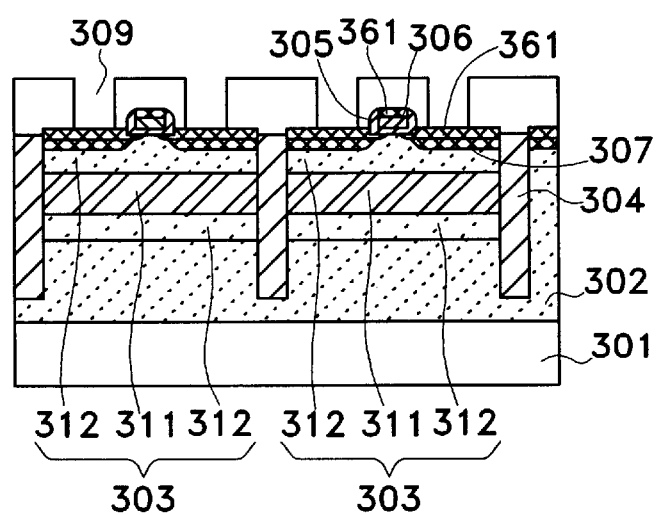
Figure 10C:
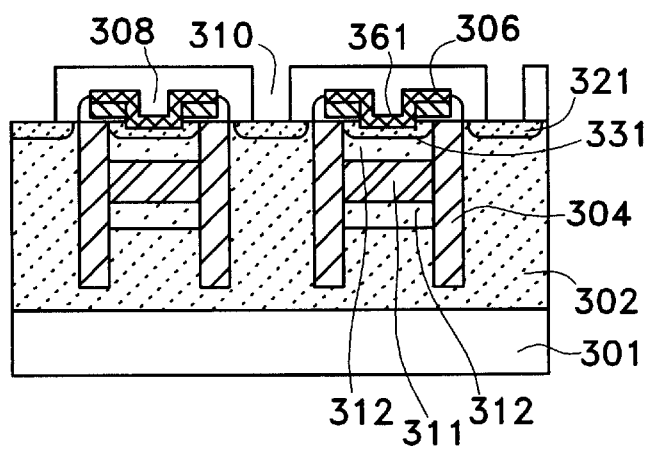

FIG. 9 schematically illustrates the layout of the transistor of the present invention and parasitic bipolar transistors. A case of an n-channel MOS transistor and parasitic npn bipolar transistors will be described below, though a case of a p-channel MOS transistor and parasitic pnp bipolar transistors can also be considered to be equivalent to this but with the polarities being symmetrically opposite (reversed).

In the MOS transistor (referred to as a "main transistor"), the source region is connected to GND, the gate electrode to an input $V_{IN}$, and the drain region to an output $V_{OUT}$. It is assumed that the potential of the shallow well region is $V_{s-well}$, and the potential of the deep well region is $V_{d-well}$.

In the main transistor as illustrated in FIG. 9, three parasitic bipolar transistors, indicated respectively by Tr1, Tr2 and Tr3 are formed in addition to the main transistor. Table 1 below shows directions of respective operating currents of these parasitic bipolar transistor.

TABLE 1

| $V_{d\text{-Well}}$ | Initial value of OUT before input | IN | Direction of current of MOSFET | Direction of current of Tr1 | Direction of current of Tr2 | Direction of current of Tr3 |
|---|---|---|---|---|---|---|
| VDD | VDD | VDD | ← | ← ○ | ↑ Δ | ↑ X |
|  |  | GND | OFF | OFF | OFF | OFF |
|  | GND | VDD | OFF | OFF | ↑ Δ | ↑ X |
|  |  | GND | OFF | OFF | OFF | OFF |
| GND | VDD | VDD | ← | ← ○ | OFF | ↓ ○ |
|  |  | GND | OFF | OFF | OFF | OFF |
|  | GND | VDD | OFF | OFF | OFF | OFF |
|  |  | GND | OFF | OFF | OFF | OFF |

The direction of each arrow in Table 1 indicating the direction of a current corresponds to the direction of an arrow in FIG. 9. The symbol "○" used in Table 1 indicates that the transistor operates to assist the operation of the main transistor; the symbol "Δ" indicates that the transistor causes a leak current which is irrelevant to the operation of the main transistor; and the symbol "X" indicates that the transistor operates to hamper the operation of the main transistor.

For example, when the potential ($V_{d\text{-well}}$) of the deep well region is fixed to the level of the power supply voltage ($V_{DD}$), and a voltage $V_{DD}$ is input to the gate electrode, the parasitic bipolar transistor Tr3 operates to hamper the operation of the main transistor. In other words, while the main transistor is operating to make (keep) the output ($V_{out}$) to be GND, the parasitic bipolar transistor Tr3 operates to make (keep) the output ($V_{out}$) to be the power supply voltage $V_{DD}$. In this case, the parasitic bipolar transistor Tr2 operates to generate a leak current which is irrelevant to the device operation.

Therefore, when the potential ($V_{d\text{-well}}$) of the deep well region is fixed to the power supply voltage ($V_{DD}$), it is necessary to design the device so that an excessive current is not conducted through the parasitic bipolar transistors Tr2 and Tr3. According to an experiment conducted by the present inventors, the current of the parasitic bipolar transistor could be suppressed to a negligible level with respect to the ON current of the main transistor, by setting the base width of the parasitic bipolar transistors Tr2 and Tr3 to be equal to or greater than 200 nm, while setting the impurity concentration of the base portion to be less than or equal to $2\times10^{17}/cm^3$. Herein, the base width means a distance from the lower end of the source region and the drain region to the lower end of the shallow well region.

When the potential ($V_{d\text{-well}}$) applied to the deep well region is set to the GNP level, the parasitic bipolar transistor operates in a way to assist the main transistor for any input/output relationship. In this case, the main transistor can conduct a current equal to the sum of the current of the main translator and the current of the parasitic bipolar transistor. Therefore, when the operation of the parasitic bipolar transistor is positively adopted, it is possible to obtain an even greater driving power than that obtained by the main transistor alone which does not exhibit the operation of the parasitic bipolar transistor.

FIG. 10 schematically illustrates a semiconductor device according to the third embodiment of the present invention, wherein: (a) is a plan view thereof: (b) is a cross-sectional view thereof along b–b' in (a); (a) is a cross-sectional view thereof along c–c' in (a): and (d) is a cross-sectional view thereof along d–d' in (a).

The device of the third embodiment corresponds to the device of claim 2.

The transistor of the third embodiment is an improvement to the second embodiment. In particular, when assuming that a plurality of transistors are to be formed on the same substrate according to the second embodiment, the adjacent transistors are to be separated by a device separation oxide film 104 (a general field oxide film). In such a case, however, the junction depth of the well region is deeper than the field oxide film. Therefore, in order to prevent shallow well regions of adjacent transistors from overlapping each other due to the diffusion between these shallow well regions, it is necessary to increase the separation width between the shallow well regions. Accordingly, the separation region becomes very large, thereby increasing the area on the semiconductor substrate to be occupied by a single transistor. This is not suitable for miniaturization.

In view of this, according to the third embodiment, the separation region is provided in the form of a groove-shaped separation region which is deeper than the shallow well region but shallower than the deep well region.

As is apparent from FIG. 10, the transistor according to the third embodiment comprises: a deep well region 302 provided in a semiconductor substrate 301; a shallow well region 303 provided on the deep well region 302, the shallow well region 303 being shallower than the deep well region 302 and having the opposite conductivity type to that of the deep well region 302; a source region 307 and a drain region 307 provided in the shallow well region 303, the source region 307 and the drain region 307 having the opposite conductivity type to that of the shallow well region 303, i.e., the same conductivity type as that of the deep well region 302; and a gate electrode 306 overlying the channel region between the source region 307 and the drain region 307 via a gate insulation film 305, thereby providing a transistor comprising the source region 307, the drain region 307 and the gate electrode 306.

This transistor is characterized in that the gate electrode 306 is electrically connected to the shallow well region 303 via a contact hole 308.

The transistor is also characterized in that a groove-shaped separation region 304 is provided between the shallow well region 303 and another shallow well region of an adjacent transistor, so that the shallow well regions are electrically separated from each other by the groove-shaped separation region 304.

Moreover, in order to reduce the resistance of the shallow well region 303, the shallow well region 303 has a structure in which a high concentration region 311 is interposed between low concentration regions 312.

Furthermore, a high impurity concentration region 321 having the same conductivity type as that of the deep well region 302 is provided so as to electrically connect the upper metal lines (not shown) with the deep well region 302 and to obtain an ohmic connection between the metal lines and the semiconductor substrate 301.

Reference numeral 331 denotes a high impurity concentration region having the same conductivity type as that of the shallow well region 303; 341 denotes a field oxide film; 361 denotes a silicide film; 308 denotes a contact hole for connecting the gate electrode 306 to the shallow well region 303; 309 denotes a contact hole for connecting the upper metal lines to the source region 307 and the drain region 307: and 310 denotes a contact hole for connecting the deep well region 302 to the upper metal lines.

A contact hole for connecting the gate electrode 306 to the upper metal lines, though not shown, may be provided on the contact hole 308 for connecting the gate electrode 306 to the shallow well region 303.

In the third embodiment, the respective depths and concentrations of the well regions 302 and 303 are similar to those in the second embodiment. The depth of the groove-shaped separation region 304 may be set to be equal to or greater than the sum of the depth of the shallow well region 303 and the width of a depletion layer which is formed by the junction between the shallow well region 303 and the deep well region 302 (more accurately, a length of the depletion layer depth which extends on the side of the deep well region 302). In this way, the respective shallow well regions 303 of adjacent transistors can be electrically separated from each other. If the depletion layer exceeds the depth of the groove-shaped separation region 304, the depletion layers of the adjacent transistors are connected to each other, thereby resulting in a punch-through between the adjacent shallow well regions 303.

In such a structure, the adjacent transistors are separated from each other only by the space of the groove-shaped separation region 304 (typically, a minimum process dimension), whereby it is possible to realize a transistor capable of dynamic threshold operation using a bulk semiconductor substrate, without using an SOI substrate, and without sacrificing the integration concentration.

Now, the structure of the contact hole 308 for obtaining an ohmic connection between the gate electrode 306 and the shallow well region 303 in the transistor of the third embodiment will be described.

In a buried channel type transistor, the gate electrode and the shallow well region have the same conductivity type, whereby an ohmic connection can be obtained even when a contact hole is provided in the gate insulation film for direct connection therebetween. In a surface channel type transistor, however, the electrode and the shallow well region have the opposite conductivity types, whereby when they are directly connected together, a PN junction is formed and an ohmic contact cannot be obtained.

In view of this, according to the third embodiment, the metal silicide film 361 and the high impurity concentration region 331 having the same conductivity type as that of the shallow well region 303 are provided between the gate electrode 306 and the shallow well region 303 so that the gate electrode 306 and the shallow well region 303 can be connected to each other with an ohmic connection irrespective of the conductivity type of the gate electrode 306 and the shallow well region 303. In particular, the elements are connected in the following order: the gate electrode 306→the metal silicide film 361→the high impurity concentration region 331 having the same conductivity type as that of the shallow well region 303 →the shallow well region 303, In such a structure, by setting the impurity concentration of the high impurity concentration region 331 to be equal to or greater than $1 \times 10^{20}/cm^3$, it is possible to obtain an ohmic connection between the metal silicide film 361 and the shallow well region 303 (since the gate electrode 306 originally has a high concentration (typically, $1 \times 10^{20}/cm^3$ or greater), it can be ohmically connected to the metal silicide film 361).

If the silicide film is directly connected to the shallow well region 303 without providing the high impurity concentration region 331 having the same conductivity type as that of the shallow well region 303, the connection will be a metal semiconductor Schottky connection, whereby an ohmic connection cannot be obtained.

A specific method for connecting the gate electrode 306 to the shallow well region 303 is to form an oxide film on a side wall of the gate electrode 306, then open the contact hole 308 in a desired region of the gate electrode 306 so as to run from the gate electrode 306 to the shallow well region 303, and perform a salicidation process. In particular, after the contact hole 308 is provided running from the gate electrode 306 to the shallow well region 303, a high melting metal is deposited therein, followed by a heat treatment to effect a reaction therebetween. In a region where the high melting metal is in contact with silicon, a silicide film is formed in a self-alignment manner, while a silicide film is also formed in the contact hole 308 running from the gate electrode 306 to the shallow well region 303, thereby electrically connecting the gate electrode 306 to the shallow well region 303. This phenomenon is based on a lateral growth of a silicide film. Since the gate insulation film is very thin (3–5 nm in this embodiment), the silicide film formed on the bottom (shallow well region 303) of the contact hole 308 is connected to the silicide film connected on the side wall (gate polycrystal silicon) of the contact hole 308. Moreover, ion implantations into the source region 307, the drain region 307, the gate electrode 306, and a contact between the gate electrode 306 and the shallow well region 303 may be performed either before or after the silicidation reaction. Alternatively, when forming a complementary device which will be described later, an ion implantation into a contact between the gate electrode 306 and the shallow well region 303 may be performed while performing an ion implantation into the source region and the drain region of the transistor having the opposite conductivity type.

Figure 11A:
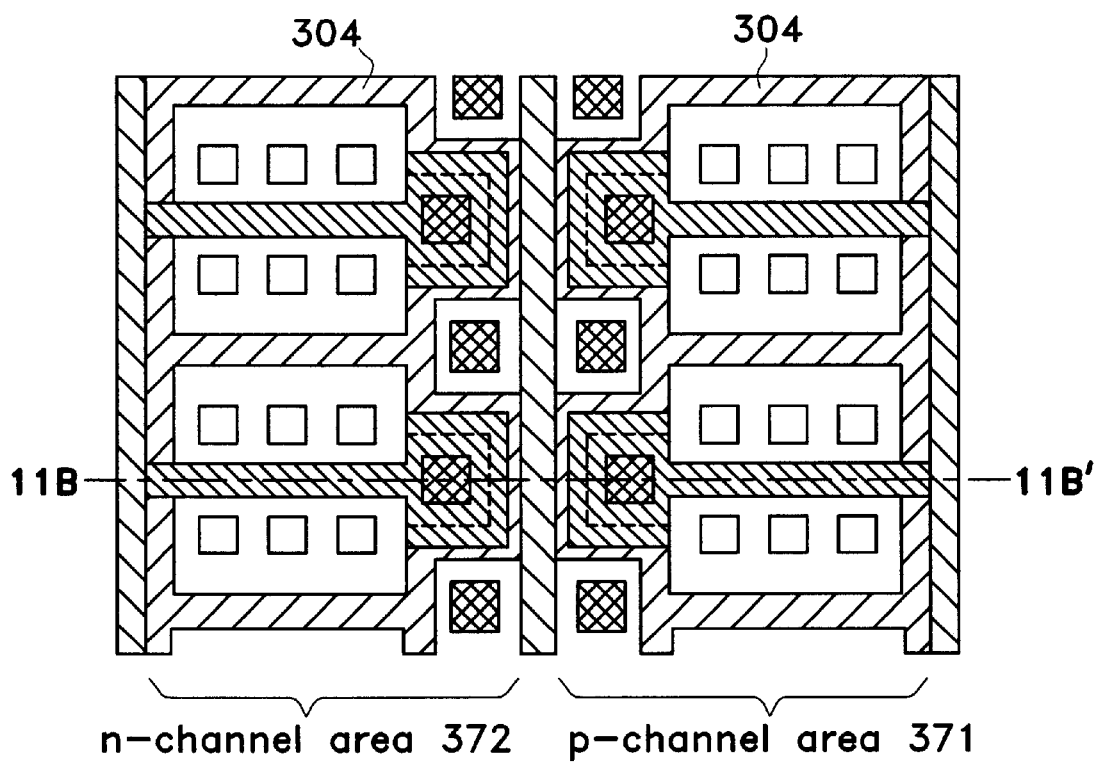
FIG. 11 schematically illustrates a semiconductor device according to the fourth embodiment of the present invention, wherein: (a) is a plan view thereof; and (b) is a cross-sectional view thereof along b–b' in (a).
Figure 11B:
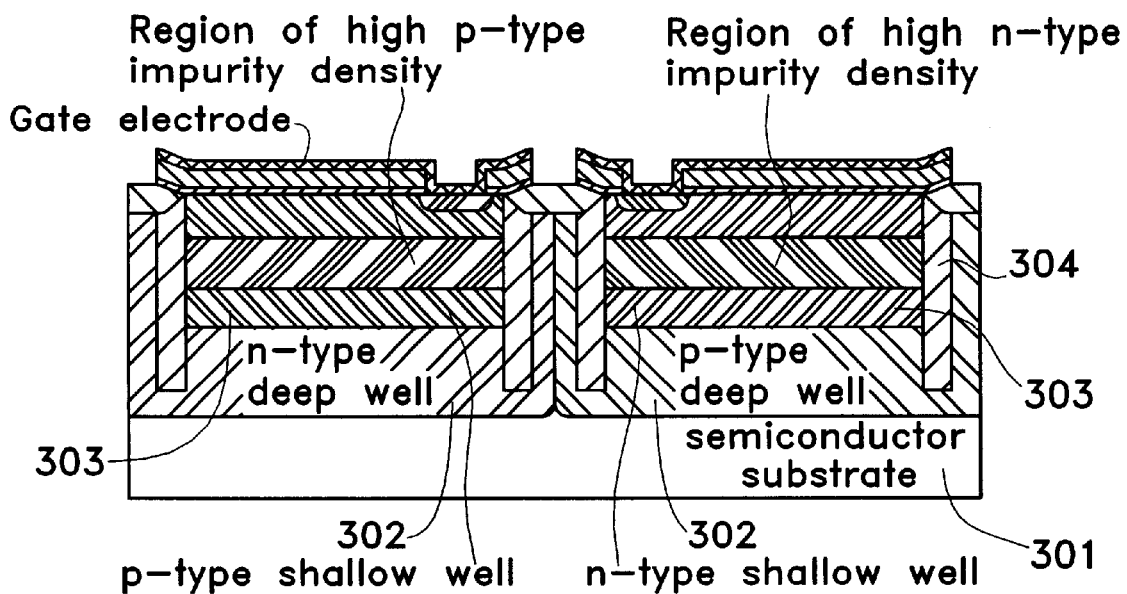

FIG. 11 schematically illustrates a semiconductor device according to the fourth embodiment of the present invention, wherein: (a) is a plan view thereof; and (b) is a cross-sectional view thereof along b–b' in (a). In the figure, members that provide similar functions to those of the device illustrated in FIG. 10 are provided with like reference numerals.

The device of the fourth embodiment corresponds to the device of claim 5, and is a complementary circuit based on the semiconductor device of the third embodiment. The device comprises a p-channel area 371 in which p-channel transistors are arranged, and an n-channel area 372 in which n-channel transistors are arranged.

In the p-channel area 371, the n-type shallow well regions 303 are provided in the p-type deep well region 302 so as to be separated from one another by the groove-shaped separation region 304, and n-channel transistor devices are provided in the respective shallow well regions 303.

Similarly, in the n-channel area 372, the p-type shallow well regions 303 are provided in the n-type deep well region 302 so as to be separated from one another by the groove-shaped separation region 304, and n-channel transistor devices are provided in the respective shallow well regions 303.

While a field oxide film as in the second embodiment can be used as means to separate the shallow well regions 303 from one another, it is preferred for suppressing the lateral extension of the shallow well region 303 to provide the separation with a groove-shaped separation region which is deeper than the shallow well region but shallower than the deep well region as illustrated in the third embodiment. Thus, the groove-shaped separation region is employed again in the fourth embodiment.

In this embodiment, the p-type deep well region and the n-type deep well region are in contact with each other. Therefore, it is necessary to ground the p-type deep well region to GND and to fix the n-type deep well region to the power supply voltage so that reverse biases result when applying bias voltages to the respective deep well regions (when the voltages are set so that a forward bias results, a forward current irrelevant to the device operation will be continuously conducted).

As described above, in view of the operation of the vertical parasitic bipolar transistor formed of the shallow well region 303 as a base and the deep well region 302 as a collector (emitter), rather than the source region 307 and the drain region 307, the operation of the main transistor is hampered by the vertical parasitic bipolar transistor. Therefore, when a complementary circuit is implemented as in the fourth embodiment, it is necessary to set the depth (related to the base width) and the concentration of the shallow well region 303 so that the vertical parasitic bipolar transistor has a gain which is as close to 1 as possible (i.e., so that the base current and the emitter current are equal to each other). In the fourth embodiment, the depth and the concentration of each well region are set as in the third embodiment.

In view of the short channel effect, variations in the threshold, etc., a surface channel type transistor is preferred which comprises a source region, a drain region and a gate electrode of the same conductivity type. In such a case, an impurity is typically introduced by an ion implantation method simultaneously into the source region, the drain region and the gate electrode.

In the complementary circuit of the fourth embodiment, the introduction of an impurity into the source region, the drain region and the gate electrode of the n-channel transistor and the introduction of an impurity into the contact area between the gate electrode and the shallow well region of the p-channel transistor are simultaneously performed in a single ion implantation process. Moreover, the introduction of an impurity into the source region, the drain region and the gate electrode of the p-channel transistor and the introduction of an impurity into the contact area between the gate electrode and the shallow well region of the n-channel transistor are simultaneously performed in a single ion implantation process. Thus, the process is simplified.

In such a surface channel type transistor, the conductivity type of the well region and the conductivity type of the gate electrode are opposite to each other, and they cannot be electrically connected to each other directly. Thus, as described above, semiconductor layers of the opposite conductivity types can be connected to each other using a salicide film for the gate electrode. Since the impurity concentration of the shallow well region is low, an ohmic contact is obtained between the silicide film and the shallow well region by introducing an impurity of a high concentration having the same conductivity type as that of the shallow well region into the contact region.

For the purpose of carrying out the present invention, the transistor is not necessarily limited to those of the surface channel type. Rather, the present invention can be carried out with a buried channel type transistor (where the source region and the drain region have the opposite conductivity type to that of the gate electrode), a metal gate (a tungsten gate, an aluminum gate, a molybdenum gate, a nitride titanium gate, a titanium-tungsten gate, etc.) or with a multilayer film gate comprising the above-described metal and a polysilicon.

Figure 12:
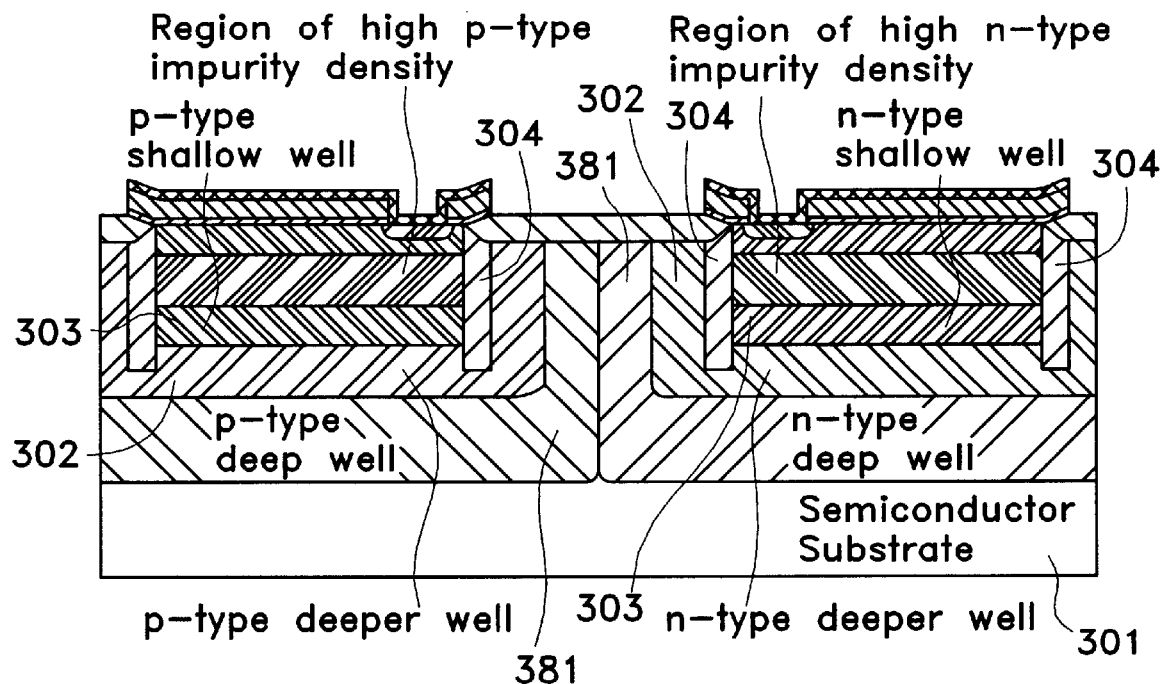
FIG. 12 is a cross-sectional view illustrating a variation of the semiconductor device of FIG. 11.

FIG. 12 is a cross-sectional view illustrating a variation of the fourth embodiment.

The transistor of this variation corresponds to claim 3.

In this variation, the deep well region 302 is provided in a deeper well region 381 having the opposite conductivity type to that of the deep well region 302, and the deep well region 302 and the deeper well region 381 are set to the same potential.

Between adjacent transistors, an n-type deeper well region 381 and a p-type deeper well region 381 are in contact with each other. Therefore, the n-type deeper well region 381 is set to the power supply voltage (i.e., the p-type deep well region 302 is set to the power supply voltage) and the p-type deeper well region 381 is grounded to GND (i.e., the n-type deep well region is grounded to GND) so that the respective deeper well regions 381 and 381 are reversely biased. Then, the vertical parasitic bipolar transistor operates in a way to assist the operation of the main transistor.

Thus, the variation can solve the problem existing in the above-described fourth embodiment, i.e., the vertical parasitic bipolar transistor hampering the operation of the main transistor.

Figure 13:
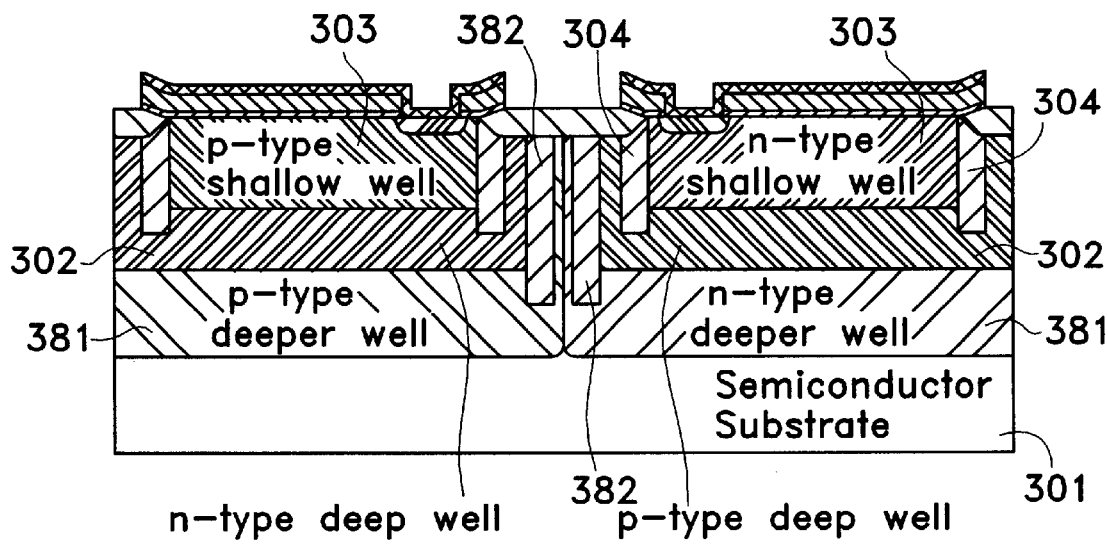
FIG. 13 is a cross-sectional view illustrating another variation of the semiconductor device of FIG. 11.

FIG. 13 is a cross-sectional view illustrating an alternative variation of the fourth embodiment.

A transistor of this alternative variation corresponds to the device of claim 4.

In this variation, in order to reduce the separation region between deep well regions and to reduce the boundary rule, thereby reducing the occupied area, a groove-shaped separation region 382 is provided for separating the respective deep well regions 302 of adjacent transistors. The groove-shaped separation region 382 is deeper than the sum of the depth of the deep well region 302 and the width of a depletion layer which is formed by the junction between the deep well region 302 and the deeper well region 381, and is shallower than the deeper well region 381.

Figure 14A:
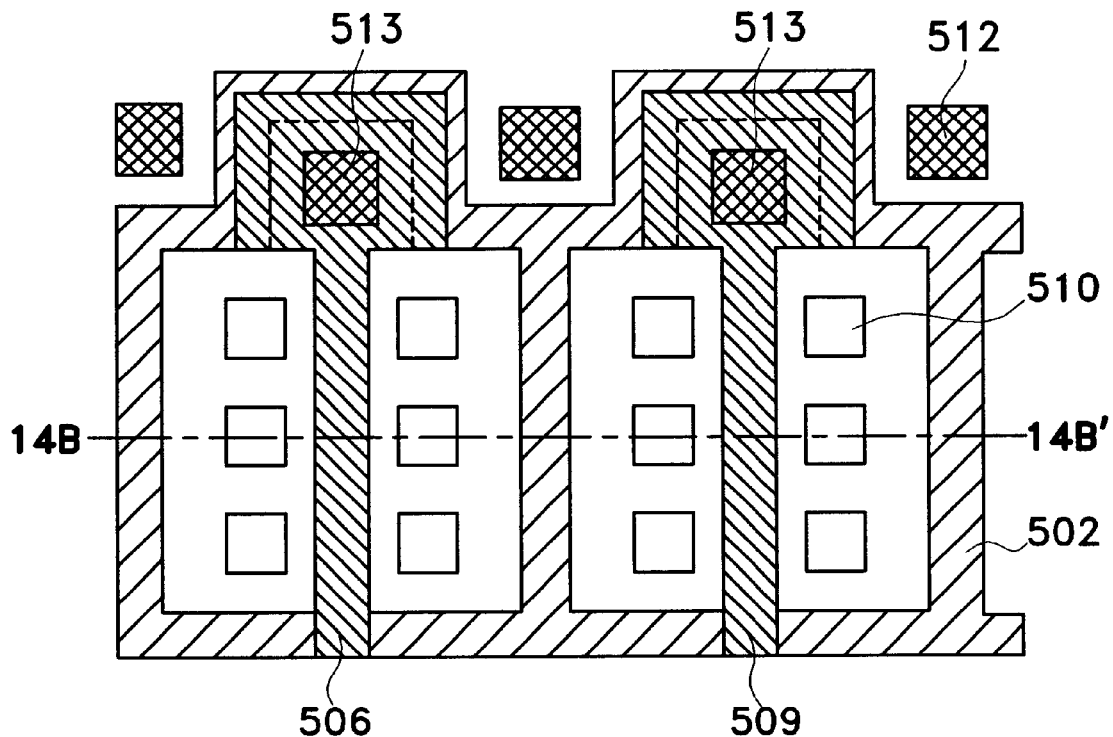
FIG. 14 schematically illustrates a semiconductor device according to the fifth embodiment of the present invention, wherein: (a) is a plan view thereof: and (b) is a cross-sectional view thereof along b–b' in (a).
Figure 14B:
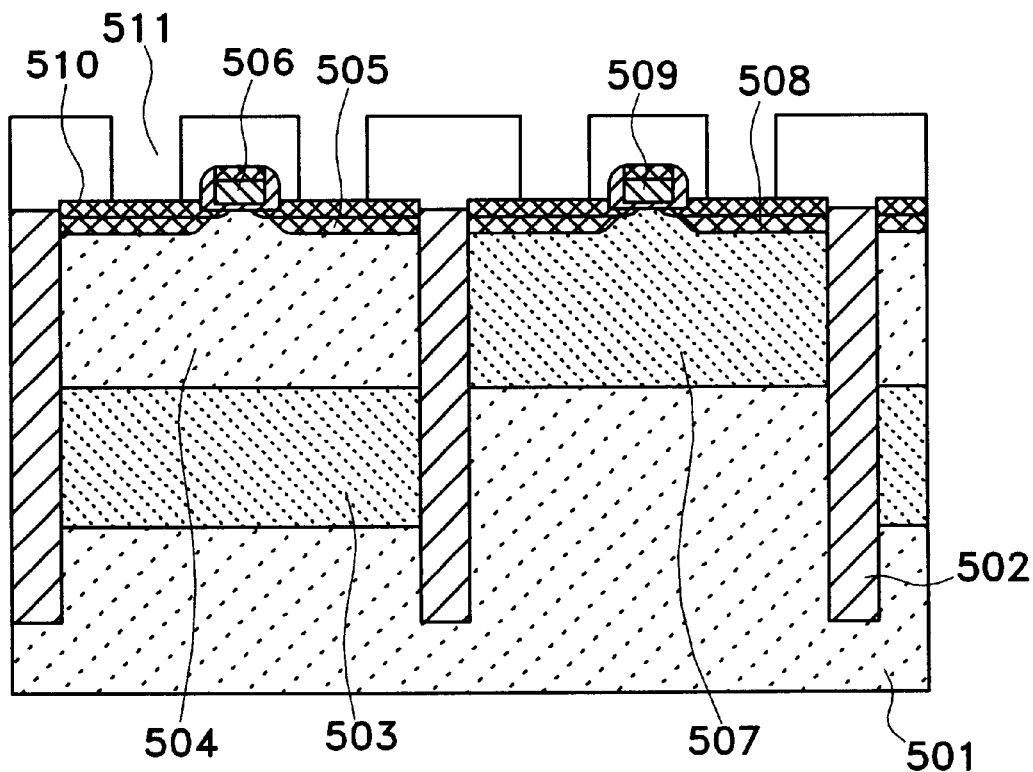

FIG. 14 schematically illustrates a semiconductor device according to the fifth embodiment of the present invention, wherein: (a) is a plan view thereof; and (b) is a cross-sectional view thereof along b–b' in (a).

The device of the fifth embodiment corresponds to the device of claim 6, and improves the freedom in the arrangement of the n-channel transistors and the p-channel transistors while maintaining the restriction as in the complementary circuit of the fourth embodiment, i.e., the limitation that transistors of the same conductivity type are arranged in one type of deep well region.

In this device, a groove-shaped separation region 502 is provided in a semiconductor substrate 501 of a p type, for example, and a plurality of active regions are provided surrounded by the groove-shaped separation region 502.

A translator having a source region and a drain region of the opposite conductivity type to that of the semiconductor substrate 501 (an n-channel transistor in this case) is provided in one of the active regions surrounded by the groove-shaped separation region 502 where a deep well region 503 of the opposite conductivity type to that of the semiconductor substrate 501 (an n-channel deep well region in this case) exists. In this active region, a shallow well region 504 of the same conductivity type as that of the semiconductor substrate 501 (a p-type shallow well region in this case) is provided on the deep well region 503, and a source region 505 and a drain region 505 having the opposite conductivity type to that of the semiconductor substrate 501 (n-type source region and drain region) are provided in the shallow well region 504, while a gate electrode 506 is electrically connected to the shallow well region 504.

A transistor having a source region and a drain region of the same conductivity type as that of the semiconductor substrate 501 (a p-channel transistor in this case) is provided in one of the active regions where a deep well region does not exist. In this active region, a shallow well region 507 of the opposite conductivity type to that of the semiconductor substrate 501 (an n-type shallow well region in this case) is provided, and a source region 508 and a drain region 508 having the same conductivity type as that of the semiconductor substrate 501 (p-type source region and drain region) are provided in the shallow well region 507, while a gate electrode 509 is electrically connected to the shallow well region 507 (an n-type shallow well region in this case).

The transistor having the source region and the drain region of the opposite conductivity type to that of the semiconductor substrate 501 and the transistor having the source region and the drain region of the same conductivity type as that of the semiconductor substrate 501 together form a complementary circuit.

For a p-type semiconductor substrate 501, it is grounded to GND. When using an n-type semiconductor substrate 501, the conductivity types of the respective regions illustrated above may be reversed, and the semiconductor substrate 501 may be set to the power supply voltage. Moreover, the deep well region 503 having the opposite conductivity type to that of the semiconductor substrate 501 has a potential which is not fixed and thus is floating. The potential can be fixed for higher resistance to the influence of the external noise.

Reference numeral 511 denotes a contact hole for connecting the source region and the drain region to the upper metal lines.

In the fifth embodiment, as in the third embodiment, the gate electrodes 506 and 509 are connected to the respective shallow well regions 504 and 507 via a silicide film 510 at the position of the contact hole 513. As in the third embodiment, a high concentration region (not shown) may be provided between a silicide film 513 and the shallow well region 507 in order to obtain an ohmic connection between the silicide film 513 and the low concentration shallow well region 507. The connection at this position is not limited to the way illustrated above. It is alternatively possible to provide a contact hole running through the gate electrode and reaching the shallow well region before the upper metal line process, with the connection being made by metal lines.

Although the deep well region 503 of the opposite conductivity type to that of the substrate (an n-type deep well region in this case) is floating, the n-type shallow well region 507 and the p-type shallow well region 504 are completely separated from each other by the groove-shaped separation region 502. Therefore, a feedback circuit such that a collector current of a parasitic bipolar transistor of one of the shallow well regions provides a base current of a parasitic bipolar transistor of the other shallow well region is not formed, so that latch-up does not occur.

In this embodiment, since a p-type semiconductor substrate 501 is used, a vertical stack is provided in the n-channel transistor comprising the n-type source region 505 and drain region 505, the p-type shallow well region 504, the deep well region 503 (floating), and the p-type semiconductor substrate 501, thus forming a parasitic thyristor therein. However, the biasing conditions for a complementary circuit are provided so that the n-type source region is grounded to GND, and the p-type semiconductor substrate is also grounded to GND via a contact hole 512, whereby the parasitic thyristor is not turned ON (no latch-up).

With such a structure, the n-channel transistor and the p-channel transistor can be freely arranged without being bound by the boundary rule, thereby increasing the freedom in design.

The depth including the width of the depletion layer which is formed by the junction between the deep well region 503 (an n-type deep well region in this case) and the semiconductor substrate 501 should not exceed that of the groove-shaped separation region 502. Of course, the depth including the width of the depletion layer which is formed by the junction between the n-type shallow well region 507 and the semiconductor substrate 501 also should not exceed that of the groove-shaped separation region 502.

Figure 15A:
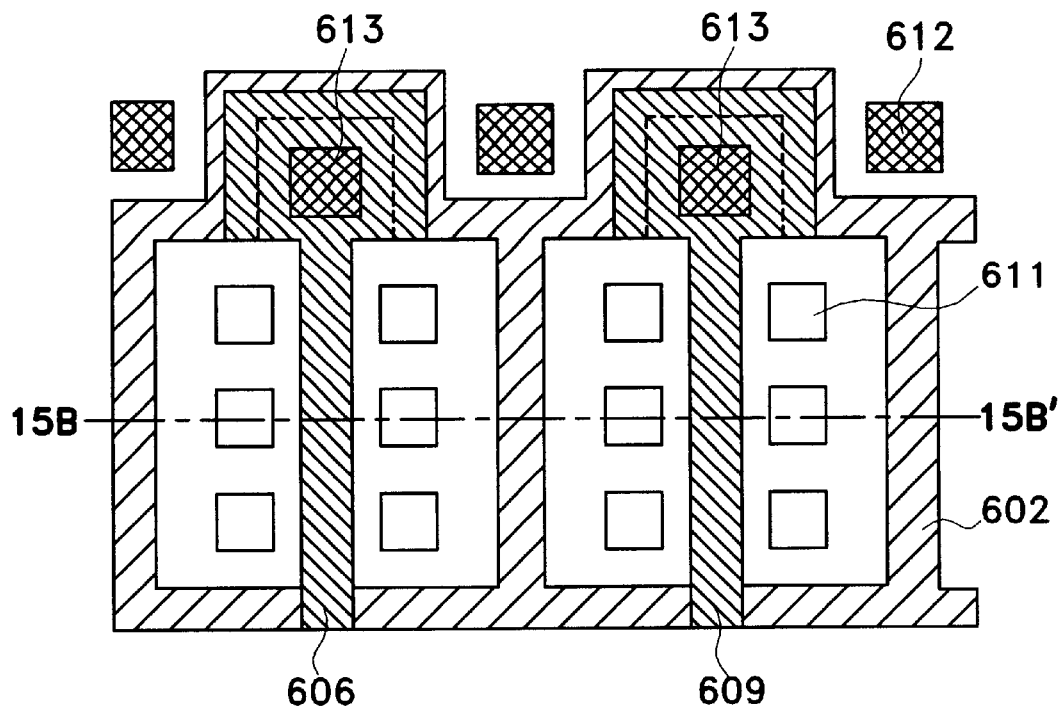
FIG. 15 schematically illustrates a semiconductor device according to the sixth embodiment of the present invention, wherein: (a) is a plan view thereof; and (b) is a cross-sectional view thereof along b–b' in (a).
Figure 15B:
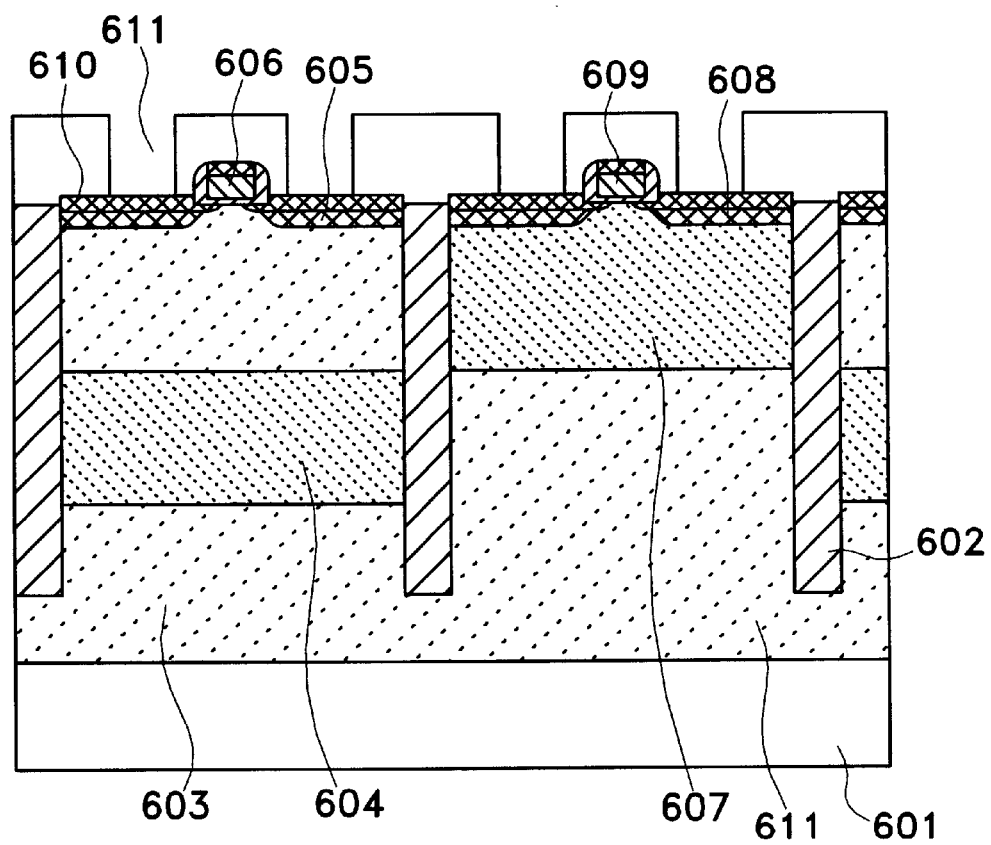

FIG. 15 schematically illustrates a semiconductor device according to the sixth embodiment of the present invention, wherein: (a) is a plan view thereof; and (b) is a cross-sectional view thereof along b–b' in (a).

The device of the sixth embodiment corresponds to the device of claim 7, and is intended to improve the freedom in the arrangement of the n-channel transistors and the p-channel transistors as in the fifth embodiment.

The device comprises: a deeper well region 611 (p-type in this case) provided in a semiconductor substrate 601; and a groove-shaped separation region 602 provided in the deeper well region 611, wherein a plurality of active regions are formed to be surrounded by the groove-shaped separation region 602.

As in the fifth embodiment, either one of the two types of transistors of the complementary circuit is provided in each of the active regions. In particular, one type of transistor comprises an n-type deep well region 603, a p-type shallow well region 604, and an n-type source region 605 and drain region 605 provided in an active region, The other type of transistor comprises an n-type shallow well region 607, and a p-type source region 608 and drain region 608 provided in an active region.

Conversely, when forming an n-type deeper well region 611, a p-type deep well region, an n-type shallow well region, and a p-type source region and drain region may be provided in an active region, while forming a p-type shallow well region, and an n-type source region and drain region in another active region.

The gate electrodes 606 and 609 are electrically connected to the corresponding shallow well regions 604 and 607, respectively, via a contact hole 613.

Reference numeral 610 denotes a silicide film, 611 denotes a contact hole for connecting the source region and drain region to the upper metal lines, and 612 denotes a contact hole for connecting the semiconductor substrate 601 to the upper metal lines.

In this embodiment, the deeper well region 611 is set to a constant potential. Since the deeper well region 611 is of p type, the deeper well region 611 may be grounded to GND via the contact hole 612.

The device of the sixth embodiment as described above has a structure in which the deeper well region 611 is additionally provided to the semiconductor substrate of the fifth embodiment, where it is possible to freely set the concentration of the deeper well region 611.

The potential of the deep well region 603 is not fixed but floating. Therefore, the potential may be fixed for higher resistance to the influence of the external noise.

The latch-up can be treated a(in the fifth embodiment. With this structure, the n-channel transistor and the p-channel transistor can be freely arranged without being bound by the boundary rule, thereby increasing the freedom in design.

Figure 16A:
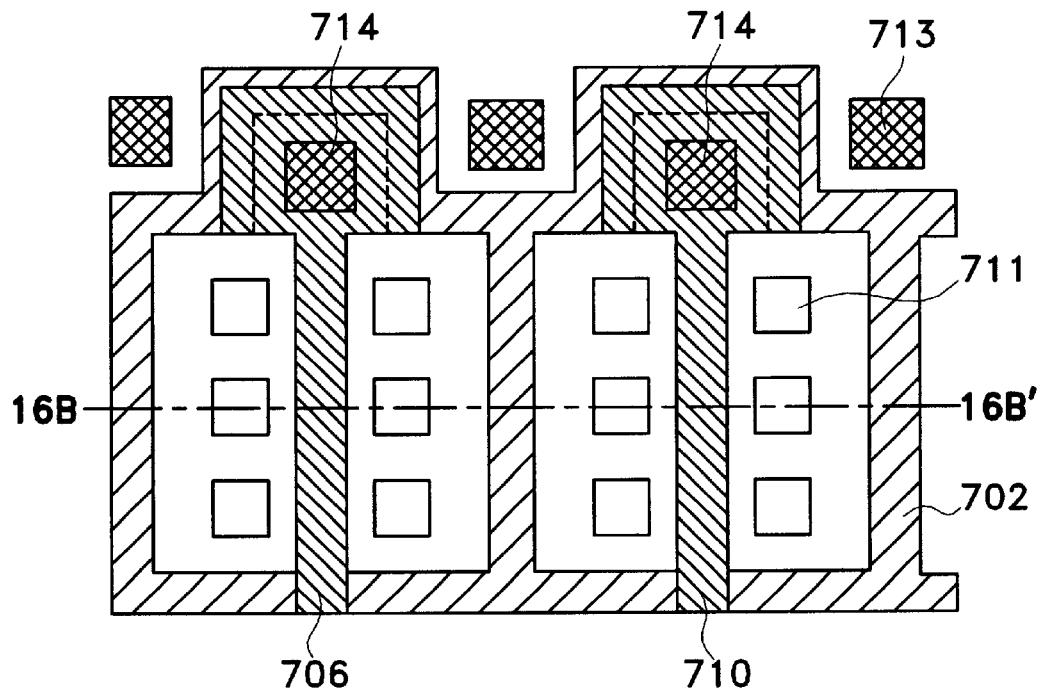
FIG. 16 schematically illustrates a semiconductor device according to the seventh embodiment of the present invention, wherein: (a) is a plan view thereof; and (b) is a cross-sectional view thereof along b–b' in (a).
Figure 16B:
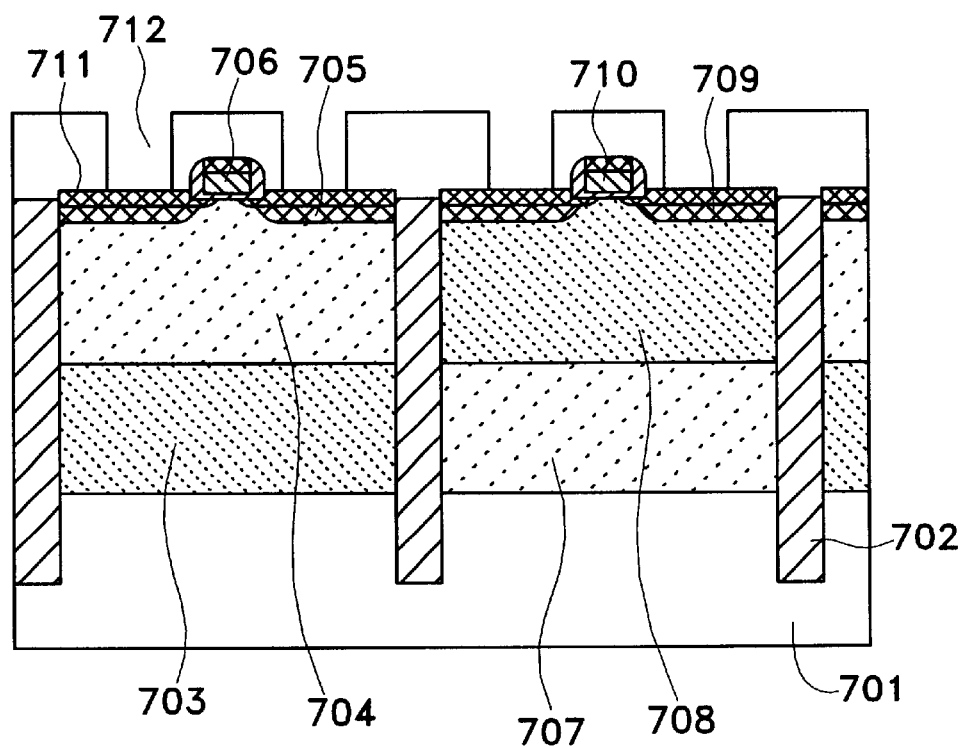

FIG. 16 schematically illustrate a semiconductor device according to the seventh embodiment of the present invention, wherein; (a) is a plan view thereof; and (b) is a-cross-sectional view thereof along b–b' in (a).

The device of the seventh embodiment corresponds to the device of claim 8, and is intended to improve the freedom in the arrangement of the n-channel transistors and the p-channel transistors as in the fifth embodiment.

The device comprises a groove-shaped separation region 702 in a semiconductor substrate 701 (p type in this case), wherein a plurality of active regions are formed to be surrounded by the groove-shaped separation region 702.

As in the fifth embodiment, either one of the two types of transistors of the complementary circuit is provided in each of the active regions. In particular, one type of transistor comprises an n-type deep well region 703, a p-type shallow well region 704, and an n-type source region 705 and drain region 705 provided in an active region. The other type of transistor comprises a p-type deep well region 707, an n-type shallow well region 708, and a p-type source region 709 and drain region 709 provided in an active region.

The gate electrodes 706 and 710 are electrically connected to the corresponding shallow well regions 704 and 707, respectively, via a contact hole 714. Reference numeral 712 denotes a contact hole for connecting the source region and drain region to the upper metal lines.

In this embodiment, the semiconductor substrate 701 is provided with a constant potential via a contact hole 713. Since the semiconductor substrate 701 is of p type, the semiconductor substrate 701 may be grounded to GND. Then, the deep well region 707 of the same conductivity type as that of the p-type semi-conductor substrate 701 is also grounded (in the case of n type, it may be set to the power supply voltage).

The deep well region 703 of the opposite conductivity type to that of semiconductor substrate 701 has a potential which is not fixed and thus is floating. The potential can be fixed for higher resistance to the Influence of the external noise.

The latch-up can be treated as in the fifth embodiment, with this structure, the n-channel transistor and the p-channel transistor can be freely arranged without being bound by the boundary rule, thereby increasing the freedom in design.

Figure 17A:
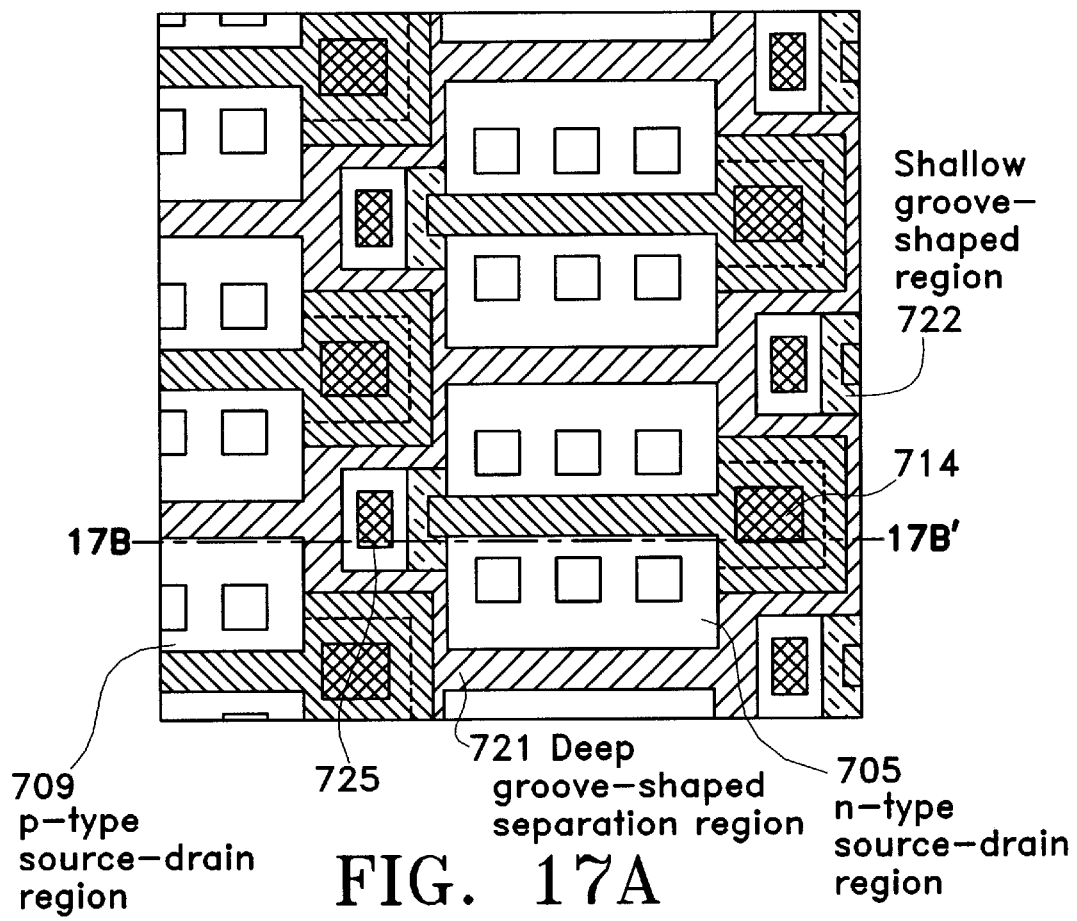
FIG. 17 schematically illustrates a variation of the semiconductor device of FIG. 16, wherein: (a) is a plan view thereof: and (b) is a cross-sectional view thereof along b–b' in (a).
Figure 17B:
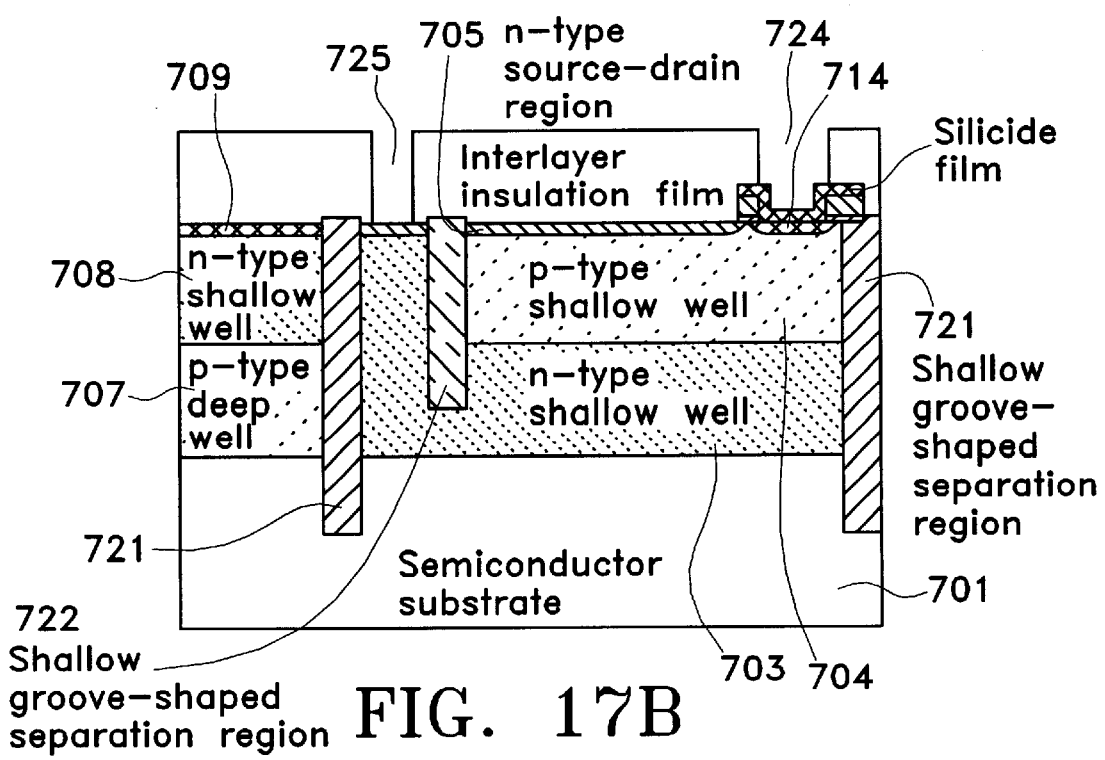

FIG. 17 illustrates a variation of the seventh embodiment, wherein: (a) is a plan view thereof; and (b) is a cross-sectional view thereof along b–b' in (a).

In the seventh embodiment, the deep well region 703 of the opposite conductivity type to that of semiconductor substrate 701 is floating. In view of this, the variation comprises a structure for guiding the deep well region 703 to the surface of the semiconductor substrate 701 for fixing the potential thereof.

In particular, a deep groove-shaped separation region 721 is provided in the semiconductor substrate 701, and an active region is provided to be surrounded by the deep groove-shaped separation region 721. A shallow groove-shaped separation region 722 is provided in the deep well region 703 in the active region so that the active region is divided into two regions by the shallow groove-shaped separation region 722, wherein the shallow well region 704 is provided in one of the regions, while the deep well region 703 is guided to the surface of the semiconductor substrate 701 in the other region.

Reference numeral 724 denotes a contact hole for connecting the gate electrode and the upper metal lines, and 725 denotes a contact hole for connecting the deep well region 703 to the upper metal lines.

In the transistors of the above-described embodiments, it is necessary to set the following conditions in order to assure an appropriate operation thereof.

Basically, a depletion layer formed by one pn junction should not be connected to another depletion layer formed by another pn junction. For example, assume that a transistor on a p-type semiconductor substrate comprises an n-type source region and drain region, a p-type shallow well region, and an, n-type deep well region, wherein the structure down to the n-type deep well region is separated by a groove-shaped separation region. In such a case, the depletion layer formed by the junction between the n-type source region and drain region and the p-type shallow well region should not be connected to the depletion layer formed by the junction between the p-type shallow well region and the n-type deep well region. If they are connected to each other, the n-type source region and drain region and the n-type deep well region will be punched through and electrically connected together.

Moreover, the depletion layer formed by the junction between the n-type source region and the p-type shallow well region should not be connected to the depletion layer formed by the junction between the n-type drain region and the p-type shallow well region. If they are connected to each other, a punch-through occurs between the source region and the drain region.

Furthermore, the depletion layer formed by the junction between the n-type deep well region and the p-type semiconductor substrate should not be connected to the depletion layer formed by the junction between another n-type region (i.e., an n-type deep well region of an adjacent transistor) and the p-type semiconductor substrate. Therefore, the depth of the groove-shaped separation region should be greater than the depth of the n-type deep well region including the depletion layer (the sum of the depth of the n-type deep well region and the width extending under the depletion layer formed by the junction between the deep well region and the p-type semiconductor substrate).

In particular, it is necessary to determine the respective depths of the semiconductor layer regions and the depth of the groove-shaped separation region so as to satisfy the condition that a depletion layer formed by one pn junction not be connected to another depletion layer formed by another pn junction. Since the width of the depletion layer is determined by the mutual relationship among the respective concentrations of the semiconductor layers, these depths cannot be determined uniquely. However, a basic operation of a transistor can be satisfied as long as the above-described condition is met, Therefore, after the condition is met, the resistance and the concentration (related to the parasitic capacitance) of the shallow well region can be used as a guideline for designing the device.

EXAMPLE

Next, a more specific example of the present invention will be described.

As described above, the present invention has an objective of realizing a dynamic threshold operation based on the use of a bulk semiconductor substrate, and the present invention is based on the use of a well region of a bulk semiconductor substrate in place of the body of a conventional SOI substrate which has been considered to be problematic because of its high resistance.

Irrespective of whether a bulk semiconductor substrate or an SOI substrate is used, there is an upper limit to the impurity concentration of the channel region, which is related to the threshold as described above. Moreover, an SOI substrate has a small body thickness, and thus a very high resistance.

On the contrary, in the present invention, there is no particular limit to the depth of a well region in a bulk semiconductor substrate, and the concentration of a region irrelevant to the channel region can be increased as desired while keeping a low concentration of the channel region. Thus, the resistance of the well region (corresponding to the body of an SOI substrate) can be reduced (although, ultimately, the depth of the well region can be increased by the thickness of the semiconductor substrate, it can be increased only to about 5 μm to be in a commonly acceptable range, because the groove-shaped separation region has to be even deeper).

At a position where the source region and drain region are in contact with the shallow well region, the junction capacitance should be made as small as possible (the capacitance should be small because the speed of a circuit is determined by the amount of current flowing therethrough and the CR time constant), and the concentration of a well region at the contact position should preferably be as low as possible. Also for the concentration of the deep well region or the shallow well region on the side contacting the semiconductor substrate, the junction capacitance between the deep well region and the shallow well region should be as small as possible, and the concentration of the shallow well region should preferably be as low as possible.

In order to further clarify these points, a single transistor having a structure as illustrated in FIG. 18(*a*) (similar structure to that of the third embodiment illustrated in FIG. 10) will be illustrated as an example, and the respective concentrations of the semiconductor layers thereof and the production method therefor will be described below.

In the figure, members that provide similar functions to those of the device illustrated in FIG. 10 are provided with like reference numerals.

In this example, the depth d1 of the source region 307 and drain region 307 may be set to 50–200 nm, the peak concentration of the regions 307 to $1 \times 10^{19}/\text{cm}^3$ or greater (preferably, $1 \times 10^{20}/\text{cm}^3$ or greater), the depth d2 of the upper low impurity concentration region 312 in the shallow well region 303 to 100–500 nm from the surface of the semiconductor substrate 301 (as described above, the depletion layer d7 extending from the source region 307 and the drain region 307 is preferably so deep that it does not overlap the high concentration region 311), the concentration of the high concentration region 312 to $1 \times 10^{16}$–$1 \times 10^{18}/\text{cm}^3$ (preferably, $1 \times 10^{16}$–$2 \times 10^{17}/\text{cm}^3$ when the concentration of the well region is too low, it is necessary to increase the concentration thereof in the vicinity of the channel in order to control the threshold), and the peak concentration of the high concentration region 311 in the shallow well region 303 to $5 \times 10^{17}/\text{cm}^3$ or greater (possibly, about $1 \times 10^{21}$–$1 \times 10/\text{cm}^3$, a commonly acceptable upper limit).

For the production method, the simplest way is to form the shallow well region 303 of a uniform concentration (a high temperature annealing process at about 1000° C.–1100° C. can be performed after the ion implantation), and then to form the high concentration region 311 by an ion Implantation method. Although it depends upon the injection energy, the concentration can be set so that the peak concentration will exist in the range (200–700 nm) of the depth d3 from the semiconductor substrate 301 to be within a commonly acceptable range. Alternatively, it is possible to perform a number of (commonly, 2 to 3) injections with varied injection energies so that the high concentration region 311 exists in a wide range in the depth direction.

While depth d4 down to the lower region 312 of low concentration in the shallow well region 303 (the depth reaching the deep well region 302) depends upon the depth of the groove-shaped separation region 304, the depth d4 may be about 300–3000 nm to be in a commonly acceptable range. Moreover, the concentration thereof may be the same as that of the upper region 312 of low concentration (of course, the concentration gradually lowers in the depth direction, and a junction isbasically formed at a position where the concentration is equal to the impurity concentration of the deep well region 302). The concentration of the deep well region 302 may be set to about $1\times10^{16}/cm^3$–$1\times 10^7/cm^3$.

As a specific example, a transistor was provided while setting the depth d4 of the shallow well region 303 from the surface of the semiconductor substrate 301 to 1.0 $\mu$m, the concentration of the low concentration region 312 to $5\times10^{16}/cm^3$–$8\times10^{16}/cm^3$, the peak concentration of the high concentration region 311 to $5\times10^{18}/cm^3$–$8\times10_{18}/cm^3$, the depth d3 of the peak position from the surface of the semiconductor substrate 301 to 600 nm, the concentration of the deep well region 302 to $5\times10^{16}/cm^3$, the depth of the groove-shaped separation region 304 to 1.6 $\mu$m, and the thickness of the gate oxide film to 3 nm. In this transistor, at a power supply voltage of 0.5 V, ON currents of 0.2–0.25 mA (NMOS; gate length: 0.1 $\mu$m) and 0.08–0.13 mA (PMOS: gate length: 0.13 $\mu$m) were achieved, and the apparent threshold was 0.10–0.15 V. A ring oscillator using the complementary inverter had a propagation delay time of about 30 psec per stage.

FIGS. 18(b) and 18(c) each show an effective carrier concentration along a–a' in FIG. 18(a). FIG. 18(b) and 18(a) respectively show profiles for relatively higher and lower concentrations of the high concentration region 311 in the shallow well region 303.

In this embodiment, the high impurity concentration region 311 is sandwiched between the low impurity concentration regions 312. As is apparent from FIGS. 18(b) and 18(c), the actual structure is designed so that the impurity concentration changes continuously, and the peak concentration of the high concentration region 311 will exist around 300–700 nm from the surface, for example, resulting in a structure in which the concentration is gradually decreased toward the boundary between the surface of the semiconductor substrate 301 and the deep well region. Therefore, there is no well-defined boundary between the high concentration region 311 and the low concentration regions 312.

In this embodiment, the well regions are formed by an ion implantation method. For example, the shallow well region 303 in which the concentration transients as follows from the surface of the semiconductor substrate 301: low concentration→high concentration low concentration, can be provided by: performing an injection at a low dose (commonly. $2\times10^{13}/cm^3$ or less): performing a drive process at a temperature of about 1000° C.–1100° C. (the injection dose, the energy, the drive temperature and the duration are related to the depth of the groove-shaped separation region 304 and the concentration of the deep well region 302, and may basically be set to any values as long as the relationship condition with respect to the groove-shaped separation region 304, which will be described later, is satisfied) so as to form the shallow well region 303 having a relatively uniform and low concentration; and then performing an injection process at a high concentration ($1\times10^{13}/cm^3$ or greater) by a high energy injection process (in practice, this can be achieved while oxidizing the gate of the transistor, and/or while performing an active annealing process for the source region and drain region).

Now, the relationship among the depth of the groove-shaped separation region 304, the concentration of the deep well region 302 and the concentration of the shallow well region 303 will be discussed. Basically, it is necessary that the adjacent shallow well regions 303 are electrically separated from each other. In particular, when the depletion layer at the junction between the shallow well region 303 and the deep well region 302 is connected to another depletion layer at the junction between an adjacent shallow well region and an adjacent deep well region, a punch through occurs between the shallow well regions. Thus, it is necessary to separate them from each other. In order to prevent the punch through, it is necessary to set the depth of the groove-shaped separation region 304 separating adjacent shallow well regions from each other to be so deep that the depletion layer at the junction between the shallow well region 303 and the deep well region 302 is not connected to another depletion layer at the junction between an adjacent shallow well region and an adjacent deep well region. As a specific example, when a junction is formed between a shallow well region having a depth of about 1 $\mu$m and a concentration of about $1\times10^{17}/cm^3$ and a deep well region having a concentration of $5\times10/cm^3$. a depletion layer of about d5=200–250 nm extends from the junction toward the deep well region, and another depletion layer of about d6=100 nm extends from the junction toward the shallow well region. Therefore, the depth of the groove-shaped separation region 304 needs to be at least about 1.3 $\mu$m, and may be designed to a depth of about 1.5–1.7 $\mu$m with some margin.

INDUSTRIAL APPLICABILITY

As is apparent from the above description, in the semiconductor device of claim 1, the resistance of the well region corresponds to the body resistance of the conventional SOI substrate. The resistance of the well region can be made very small, and thus the device can operate at a speed much higher than that of a DTMOS using the conventional SOI substrate.

Moreover, since the shallow well region has a structure in which the high impurity concentration region is sandwiched between low impurity concentration regions, the resistance of the well region can be further reduced. With such a structure, it is possible to effectively reduce the resistance of the well region by the high concentration region in the middle of the shallow well region, while maintaining a low threshold by one of the low concentration regions on the channel side, without increasing parasitic capacitances of the source region and the drain region (when the impurity concentration of the shallow well region at the junction between the source region and the drain region is high, the depletion layer does not sufficiently extend, thereby increasing the junction capacitance), and without increasing the parasitic capacitance between one of the low concentration regions in the shallow well region existing on the deeper well region side and the deep well region.

Moreover, in the semiconductor device of claim 3, the deeper well region is provided between the adjacent deep well regions so as to electrically separate the adjacent deep well regions from each other. Particularly, when providing a complementary element having p-type and n-type deep well regions together on a single semiconductor substrate, the deep well regions are separated by a deeper well region having an opposite conductivity type, whereby it is possible to ground the n-type deep well region to GND, and to set the p-type deep well region to the power supply voltage.

Furthermore, the structures of the semiconductor devices of claims 6, 7 and 8 are preferred for realizing a complementary circuit, and allow for free arrangement of n-channel and p-channel elements, without increasing the area to be occupied by a transistor or having to provide a boundary rule between the well regions (the n well and the p well must be separated by at least a certain distance so that latch-up does not occur).

What is claimed is:

1. A semiconductor device, comprising:
a semiconductor substrate;
a deep well region of a first conductivity type provided in the semiconductor substrate;
a shallow well region of a second conductivity type provided in the deep well region;
a source region and a drain region of the first conductivity type provided in the shallow well region;
a channel region provided between the source region and the drain region;
a gate insulation film provided on the channel region; and
a gate electrode provided on the gate insulation film, wherein:
the gate electrode is electrically connected to the shallow well region corresponding to the gate electrode; and
the shallow well region is electrically separated from an adjacent shallow well region and has a structure in which a region of a high impurity concentration is sandwiched between low impurity concentration regions.

2. A semiconductor device according to claim 1, wherein the shallow well regions adjacent to each other are electrically separated from each other by a groove-shaped separation structure which is deeper than each of the shallow well regions but shallower than the deep well region.

3. A semiconductor device according to claim 2, wherein the semiconductor device forms a complementary circuit.

4. A semiconductor device according to claim 3, wherein in the shallow well region of the semiconductor device, a depletion layer formed by a junction between the low impurity concentration region and the source region and the drain region is not in contact with the high impurity concentration region.

5. A semiconductor device according to claim 3, wherein the high impurity concentration region in the shallow well region of the semiconductor device has an impurity concentration at its peak position in a concentration range of $1\times10^{21}/cm^3 - 5\times10^{17}/cm^3$.

6. A semiconductor device according to claim 3, wherein the low impurity concentration region in the shallow well region of the semiconductor device has an impurity concentration in a concentration range of $1\times10^{18}/cm^3 - 1\times10^{16}/cm^3$.

7. A semiconductor device according to claim 2, wherein in the shallow well region of the semiconductor device, a depletion layer formed by a junction between the low impurity concentration region and the source region and the drain region is not in contact with the high impurity concentration region.

8. A semiconductor device according to claim 2, wherein the high impurity concentration region in the shallow well region of the semiconductor device has an impurity concentration at its peak position in a concentration range of $1\times10^{21}/cm^3 - 5\times10^{17}/cm^3$.

9. A semiconductor device according to claim 2, wherein the low impurity concentration region in the shallow well region of the semiconductor device has an impurity concentration in a concentration range of $1\times10^{18}/cm^3 - 1\times10^{16}/cm^3$.

10. A semiconductor device according to claim 1, the semiconductor device forms a complementary circuit.

11. A semiconductor device according to claim 1, wherein in the shallow well region of the semiconductor device, a depletion layer formed by a junction between the low impurity concentration region and the source region and the drain region is not in contact with the high impurity concentration region.

12. A semiconductor device according to claim 1, wherein the high impurity concentration region in the shallow well region of the semiconductor device has an impurity concentration at its peak position in a concentration range of $1\times10^{21}/cm^3 - 5\times10^{7}/cm^3$.

13. A semiconductor device according to claim 1, wherein the low impurity concentration region in the shallow well region of the semiconductor device has an impurity concentration in a concentration range of $1\times10^{18}/cm^3 - 1\times10^{16}/cm^3$.

14. A semiconductor device, comprising:
a semiconductor substrate;
a deeper well region of a first conductivity type provided in the semiconductor substrate;
a deep well region of a second conductivity type provided in the deeper well region;
a shallow well region of the first conductivity type provided in the deep well region of the second conductivity type;
a source region and a drain region of the second conductivity type provided in the shallow well region;
a channel region provided between the source region and the drain region;
a gate insulation film provided on the channel region; and
a gate electrode provided on the gate insulation film, wherein:
the gate electrode is electrically connected to the shallow well region corresponding to the gate electrode;
the deep well region and the shallow well region are electrically separated respectively from an adjacent deep well region and an adjacent shallow well region; and
the shallow well region has a structure in which a high impurity concentration region is sandwiched between low impurity concentration regions.

15. A semiconductor device according to claim 14, wherein the deep well region of the second conductivity type which are adjacent to each other are electrically separated from each other by a groove-shaped separation structure which is deeper than each of the deep well regions but shallower than the deeper well region of the first conductivity type.

16. A semiconductor device according to claim 15, wherein in the shallow well region of the semiconductor device, a depletion layer formed by a junction between the low impurity concentration region and the source region and the drain region is not in contact with the high impurity concentration region.

17. A semiconductor device according to claim 15, wherein the high impurity concentration region in the shallow well region of the semiconductor device has an impurity concentration at its peak position in a concentration range of $1\times10^{21}/cm^3 - 5\times10^{17}/cm^3$.

18. A semiconductor device according to claim 15, wherein the low impurity concentration region in the shallow well region of the semiconductor device has an impurity concentration in a concentration range of $1\times10^{18}/cm^3 - 1\times10^{16}/cm^3$.

19. A semiconductor device according to claim 15, wherein the semiconductor device forms a complementary circuit.

20. A semiconductor device according to claim 3, wherein the semiconductor device forms a complementary circuit.

21. A semiconductor device according to claim 14, wherein in the shallow well region of the semiconductor device, a depletion layer formed by a junction between the low impurity concentration region and the source region and the drain region is not in contact with the high impurity concentration region.

22. A semiconductor device according to claim 3, wherein the high impurity concentration region in the shallow well region of the semiconductor device has an impurity concentration at its peak position in a concentration range of $1\times10^{21}/cm^3$–$5\times10^{17}/cm^3$.

23. A semiconductor device according to claim 14, wherein the low impurity concentration region in the shallow well region of the semiconductor device has an impurity concentration in a concentration range of $1\times10^{18}/cm^3$–$1\times10^{16}/cm^3$.

24. A semiconductor device, comprising:
   a semiconductor substrate of a first conductivity type;
   a groove-shaped separation region provided in the semiconductor substrate;
   a plurality of island-like active regions separated from one another by the groove-shaped separation region;
   a deep well region of a second conductivity type provided in at least one of the island-like active regions, the deep well region of the second conductivity type being surrounded by the groove-shaped separation region;
   a shallow well region of the first conductivity type provided for one of the island-like active regions where the deep well region surrounded by the groove-shaped separation region exists, the shallow well region of the first conductivity type being surrounded by the groove-shaped separation region;
   a shallow well region of the second conductivity type provided for another one of the island-like active regions where the deep well region surrounded by the groove-shaped separation region does not exist, the shallow well region of the second conductivity type being surrounded by the groove-shaped separation region;
   a source region and a drain region of the second conductivity type provided in the shallow well region of the first conductivity type;
   a source region and a drain region of the first conductivity type provided in the shallow well region of the second conductivity type;
   channel regions provided between the source region and the drain region of the first conductivity type and between the source region and the drain region of the second conductivity type;
   a gate insulation film provided on each of the channel regions; and
   a gate electrode provided on the gate insulation film, wherein:
   each gate electrode is electrically connected to the shallow well region corresponding to the gate electrode; and
   the shallow well region of the first conductivity type, the shallow well region of the second conductivity type, and the deep well region of the second conductivity type are electrically separated respectively from an adjacent shallow well region of the first conductivity type, an adjacent shallow well region of the second conductivity type, and an adjacent deep well region of the second conductivity type.

25. A semiconductor device according to claim 24, wherein the semiconductor substrate and the deep well region of the semiconductor device are set to a constant voltage.

26. A semiconductor device according to claim 25, wherein the shallow well region of the semiconductor device has a structure in which a high impurity concentration region is sandwiched between low impurity concentration regions.

27. A semiconductor device according to claim 26, wherein in the shallow well region of the semiconductor device, a depletion layer formed by a junction between the low impurity concentration region and the source region and the drain region is not in contact with the high impurity concentration region.

28. A semiconductor device according to claim 26, wherein the high impurity concentration region in the shallow well region of the semiconductor device has an impurity concentration at its peak position in a concentration range of $1\times10^{21}/cm^3$–$5\times10^{17}/cm^3$.

29. A semiconductor device according to claim 26, wherein the low impurity concentration region in the shallow well region of the semiconductor device has an impurity concentration in a concentration range of $1\times10^{18}/cm^3$–$1\times10^{16}/cm^3$.

30. A semiconductor device according to claim 24, wherein the shallow well region of the semiconductor device has a structure in which a high impurity concentration region is sandwiched between low impurity concentration regions.

31. A semiconductor device according to claim 30, wherein in the shallow well region of the semiconductor device, a depletion layer formed by a junction between the low impurity concentration region and the source region and the drain region is not in contact with the high impurity concentration region.

32. A semiconductor device according to claim 30, wherein the high impurity concentration region in the shallow well region of the semiconductor device has an impurity concentration at its peak position in a concentration range of $1\times10^{21}/cm^3$–$5\times10^{17}/cm^3$.

33. A semiconductor device according to claim 30, wherein the low impurity concentration region in the shallow well region of the semiconductor device has an impurity concentration in a concentration range of $1\times10^{18}/cm^3$–$1\times10^{16}/cm^3$.

34. A semiconductor device, comprising:
   a semiconductor substrate;
   a deeper well region of a first conductivity type provided in the semiconductor substrate;
   a groove-shaped separation region provided in the deeper well region;
   a plurality of island-like active regions separated from one another by the groove-shaped separation region;
   a deep well region of a second conductivity type provided in at least one of the island-like active regions, the deep well region of the second conductivity type being surrounded by the groove-shaped separation region;
   a shallow well region of the first conductivity type provided for one of the island-like active regions where the deep well region surrounded by the groove-shaped separation region exists, the shallow well region of the first conductivity type being surrounded by the groove-shaped separation region;
   a shallow well region of the second conductivity type provided for another one of the island-like active regions where the deep well region surrounded by the groove-shaped separation region does not exist, the shallow well region of the second conductivity type being surrounded by the groove-shaped separation region;
   a source region and a drain region of the second conductivity type provided in the shallow well region of the first conductivity type;

a source region and a drain region of the first conductivity type provided in the shallow well region of the second conductivity type;

channel regions provided between the source region and the drain region of the first conductivity type and between the source region and the drain region of the second conductivity type;

a gate insulation film provided on each of the channel regions; and a gate electrode provided on the gate insulation film, wherein:

each gate electrode is electrically connected to the shallow well region corresponding to the gate electrode; and the shallow well region of the first conductivity type, the shallow well region of the second conductivity type, and the deep well region of the second conductivity type are electrically separated respectively from an adjacent shallow well region of the first conductivity type, an adjacent shallow well region of the second conductivity type, and an adjacent deep well region of the second conductivity type.

35. A semiconductor device according to claim 34, wherein the semiconductor substrate, the deep well region and the deeper well region of the semiconductor device are set to a constant voltage.

36. A semiconductor device according to claim 34, wherein the shallow well region of the semiconductor device has a structure in which a high impurity concentration region is sandwiched between low impurity concentration regions.

37. A semiconductor device, comprising
a semiconductor substrate of a first conductivity type;

a groove-shaped separation region provided in the semiconductor substrate;

a plurality of island-like active regions separated from one another by the groove-shaped separation region;

a deep well region of the first conductivity type provided in at least one of the island-like active regions, the deep well region of the first conductivity type being surrounded by the groove-shaped separation region;

a deep well region of a second conductivity type provided for another one of the island-like active regions where the deep well region of the first conductivity type does not exist, the shallow well region of the second conductivity type being surrounded by the groove-shaped separation region;

a shallow well region of the second conductivity type provided in an upper portion of the deep well region of the first conductivity type, the shallow well region of the second conductivity type being surrounded by the groove-shaped separation region;

a shallow well region of the first conductivity type provided in an upper portion of the deep well region of the second conductivity type, the shallow well region of the first conductivity type being surrounded by the groove-shaped separation region;

a source region and a drain region of the second conductivity type provided in the shallow well region of the first conductivity type;

a source region and a drain region of the first conductivity type provided in the shallow well region of the second conductivity type;

channel regions provided between the source region and the drain region of the first conductivity type and between the source region and the drain region of the second conductivity type;

a gate insulation film provided on each of the channel regions; and a gate electrode provided on the gate insulation film, wherein:

each gate electrode is electrically connected to the shallow well region corresponding to the gate electrode; and the shallow well region of the first conductivity type, the shallow well region of the second conductivity type, the deep well region of the first conductivity type, and the deep well region of the second conductivity type are electrically separated respectively from an adjacent shallow well region of the first conductivity type, an adjacent shallow well region of the second conductivity type, an adjacent deep well region of the first conductivity type, and an adjacent deep well region of the second conductivity type.

38. A semiconductor device according to claim 37, wherein the semiconductor substrate and the deep well region of the semiconductor device are set to a constant voltage.

39. A semiconductor device according to claim 37, wherein the shallow well region of the semiconductor device has a structure in which a high impurity concentration region is sandwiched between low impurity concentration regions.

* * * * *